US012217951B2

(12) United States Patent
Lin et al.

(10) Patent No.: US 12,217,951 B2
(45) Date of Patent: *Feb. 4, 2025

(54) PROFILED SPUTTERING TARGET AND METHOD OF MAKING THE SAME

(71) Applicant: Honeywell International Inc., Charlotte, NC (US)

(72) Inventors: Shih-Yao Lin, Hsinchu (TW); Stephane Ferrasse, Spokane, WA (US); Jaeyeon Kim, Liberty Lake, WA (US); Frank C. Alford, Spokane Valley, WA (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/574,950

(22) Filed: Jan. 13, 2022

(65) Prior Publication Data
US 2022/0139685 A1 May 5, 2022

Related U.S. Application Data

(63) Continuation of application No. 15/947,586, filed on Apr. 6, 2018, now Pat. No. 11,244,815.
(Continued)

(51) Int. Cl.
H01J 37/34 (2006.01)
C23C 14/34 (2006.01)

(52) U.S. Cl.
CPC ...... H01J 37/3491 (2013.01); C23C 14/3407 (2013.01); H01J 37/3423 (2013.01);
(Continued)

(58) Field of Classification Search
CPC .. H01J 37/347; H01J 37/3423; H01J 37/3435; H01J 37/3491; H01J 37/3426; C23C 14/3407
See application file for complete search history.

(56) References Cited

U.S. PATENT DOCUMENTS 4,747,926 A 5/1988 Shimizu et al.
5,753,090 A 5/1998 Obinata
(Continued)

FOREIGN PATENT DOCUMENTS

CN 102656289 A 9/2012
CN 202576553 U 12/2012
(Continued)

OTHER PUBLICATIONS

Machine Translation JP 2004084007 (Year: 2004).*
(Continued)

Primary Examiner — Michael A Band
(74) Attorney, Agent, or Firm — Faegre Drinker Biddle & Reath LLP

(57) ABSTRACT

A sputtering target comprising a sputtering material and having a non-planar sputtering surface prior to erosion by use in a sputtering system, the non-planar sputtering surface having a circular shape and comprising a central axis region including a concave curvature feature at the central axis region. The central axis region having a wear profile after erosion by use in a sputtering system for at least 1000 kWhrs including a protuberance including a first outer circumferential wear surface having a first slope. A reference, protruding convex curvature feature for a reference target after sputtering use for the same time includes a second outer circumferential wear surface having a second slope. The protuberance provides a sputtered target having reduced shadowing relative to the reference, protruding convex curvature feature, wherein the first slope is less steep than a second slope.

20 Claims, 19 Drawing Sheets

Related U.S. Application Data

(60) Provisional application No. 62/487,617, filed on Apr. 20, 2017.

(52) U.S. Cl.
CPC ...... *H01J 37/3426* (2013.01); *H01J 37/3435* (2013.01); *H01J 37/347* (2013.01); *H01J 37/3432* (2013.01)

(56) References Cited

U.S. PATENT DOCUMENTS

| | | | |
|---|---|---|---|
| 5,830,327 | A | 11/1998 | Kolenkow |
| 5,850,755 | A | 12/1998 | Segal |
| 6,086,735 | A | 7/2000 | Gilman et al. |
| 6,149,776 | A | 11/2000 | Tang et al. |
| 6,340,415 | B1 | 1/2002 | Raaijmakers et al. |
| 6,416,639 | B1 | 7/2002 | De et al. |
| 6,497,797 | B1 | 12/2002 | Kim |
| 6,500,321 | B1 | 12/2002 | Ashtiani et al. |
| 6,702,930 | B1 | 3/2004 | Cheng et al. |
| 6,749,103 | B1 * | 6/2004 | Ivanov ............... C23C 14/3407 228/171 |
| 6,811,657 | B2 | 11/2004 | Jaso |
| 6,872,284 | B2 * | 3/2005 | Ivanov ............... H01J 37/3482 73/866 |
| 6,919,407 | B2 | 7/2005 | Tau et al. |
| 6,946,039 | B1 | 9/2005 | Segal et al. |
| 7,191,630 | B2 | 3/2007 | Segal |
| 7,347,353 | B2 | 3/2008 | Yamakoshi et al. |
| 7,618,520 | B2 | 11/2009 | Wu et al. |
| 7,691,240 | B2 | 4/2010 | Hort et al. |
| 7,767,043 | B2 | 8/2010 | Segal et al. |
| 8,398,833 | B2 | 3/2013 | Lee et al. |
| 8,702,919 | B2 | 4/2014 | Ferrasse et al. |
| 9,685,307 | B2 * | 6/2017 | Miyashita ........... C23C 14/3407 |
| 11,244,815 | B2 * | 2/2022 | Lin .................... H01J 37/3435 |
| 11,862,443 | B2 * | 1/2024 | Kuroda ................. C23C 14/14 |
| 2003/0178301 | A1 | 9/2003 | Lynn et al. |
| 2004/0050689 | A1 | 3/2004 | Voser et al. |
| 2004/0178056 | A1 | 9/2004 | De et al. |
| 2004/0265616 | A1 | 12/2004 | Yamakoshi et al. |
| 2006/0289291 | A1 | 12/2006 | Le et al. |
| 2007/0051624 | A1 | 3/2007 | Okabe et al. |
| 2008/0116066 | A1 | 5/2008 | Miyashita |
| 2009/0053540 | A1 | 2/2009 | Turner |
| 2009/0229975 | A1 | 9/2009 | Yamakoshi |
| 2009/0277788 | A1 | 11/2009 | Oda et al. |
| 2010/0018854 | A1 | 1/2010 | McLeod |
| 2010/0170780 | A1 | 7/2010 | Malaszewski et al. |
| 2013/0313107 | A1 | 11/2013 | Miller et al. |
| 2018/0308671 | A1 | 10/2018 | Lin et al. |

FOREIGN PATENT DOCUMENTS

| | | | |
|---|---|---|---|
| JP | 06-140330 | A | 5/1994 |
| JP | 06-306597 | A | 11/1994 |
| JP | 08-325719 | A | 12/1996 |
| JP | 11-193457 | A | 7/1999 |
| JP | 2001-011617 | A | 1/2001 |
| JP | 2003-027225 | A | 1/2003 |
| JP | 2003-166054 | A | 6/2003 |
| JP | 2004084007 | A * | 3/2004 |
| JP | 2011-518258 | A | 6/2011 |
| WO | 01/94659 | A2 | 12/2001 |
| WO | 02/42518 | A1 | 5/2002 |
| WO | 2004/024979 | A1 | 3/2004 |
| WO | 2006/054409 | A1 | 5/2006 |
| WO | 2008/091731 | A2 | 7/2008 |

OTHER PUBLICATIONS

Coincident definition. Google Search definition [https://www.google.com/search?q=coincident&rlz=1C1GCEB_en&oq=coinc&aqs=chrome.0.69i59j69i57j0i433i457j0i433l5.2131j0j1&sourceid=chrome&ie=UTF-8].

Frerrasse, S.; et al. "Texture Evolution During Equal Channel Angular Extrusion Part I. Effect of Route, Number of Passes and Initial Texture." Materials Science and Engineering A, 368:28-40, Mar. 15, 2004.

International Search Report and Written Opinion received for PCT Patent Application No. PCT/US2018/027934, mailed on Jul. 26, 2018, 10 pages.

* cited by examiner

PROFILED SPUTTERING TARGET AND METHOD OF MAKING THE SAME

CROSS-REFERENCE TO RELATED APPLICATION

This application is a continuation of U.S. application Ser. No. 15/947,586, filed Apr. 6, 2018, which claims priority to Provisional Application No. 62/487,617, filed Apr. 20, 2017, both of which are herein incorporated by reference in their entireties.

FIELD OF THE INVENTION

The field of the subject matter is the design and use of sputtering systems including targets having a central axis region geometry to provide longer target life and uniform film deposition.

DESCRIPTION OF RELATED ART

Electronic and semiconductor components are used in ever-increasing numbers of consumer and commercial electronic products, communications products and data-exchange products. Examples of some of these consumer and commercial products are televisions, computers, cell phones, pagers, handheld organizers, portable music players and radios, car stereos, and remote controls. As the demand for these consumer and commercial electronics increases, there is also a demand for those same products to become smaller and more portable for the consumers and businesses.

As a result of the size decrease in these products, the components that comprise the products must also become smaller and/or thinner. Examples of some of those components that need to be reduced in size or scaled down are microelectronic chip interconnections, semiconductor chip components, resistors, capacitors, printed circuit or wiring boards, wiring, keyboards, touch pads, and chip packaging.

When electronic and semiconductor components are reduced in size or scaled down, any defects that are present in the larger components are going to be exaggerated in the scaled down components. Thus, the defects that are present or could be present in the larger component should be identified and corrected, if possible, before the component is scaled down for the smaller electronic products.

In order to identify and correct defects in electronic, semiconductor and communications components, the components, the materials used and the manufacturing processes for making those components should be broken down and analyzed. Electronic, semiconductor and communication/data-exchange components are composed, in some cases, of layers of materials, such as metals, metal alloys, ceramics, inorganic materials, polymers, or organometallic materials. The layers of materials are often thin (on the order of less than a few tens of angstroms in thickness). In order to improve on the quality of the layers of materials, the process of forming the layer—such as physical vapor deposition of a metal or other compound—should be evaluated and, if possible, modified and improved.

In order to improve the process of depositing a layer of material, the surface and/or material composition must be measured, quantified and defects or imperfections detected. In the case of the deposition of a layer or layers of material, it is not the actual layer or layers of material that should be monitored but the material and surface of that material that is being used to produce the layer of material on a substrate or other surface. For example, when depositing a layer of metal onto a surface or substrate by sputtering a target comprising that metal, the atoms and molecules being deflected or liberated from the target must travel a path to the substrate or other surface that will allow for an even and uniform deposition. Atoms and molecules traveling natural and expected paths after deflection and/or liberation from the target can unevenly deposit on the surface or substrate, including trenches and holes in the surface or substrate. For certain surfaces and substrates, it may be necessary to redirect the atoms and molecules leaving the target in order to achieve a more uniform deposition, coating and/or film on the surface or substrate.

In DC magnetron sputtering systems, the buildup of insulating layer on poorly eroding race tracks and subsequent arcing on such layer have been the important issues for both process engineers and target manufacturers. Well-eroding and poorly-eroding "race tracks" develop due to the nature of magnet configuration. On the poorly eroding race tracks, insulating layers build up slowly with target usage (i.e., oxide or nitride films for Al, Ta, and Ti targets). Eventually, the charge accumulation on the dielectric layer leads to arcing and particle generation. The propensity of arcing increases with target usage because of the buildup of dielectric layer.

A schematic view of a portion of an exemplary physical vapor deposition apparatus 10 is illustrated in FIG. 1. A sputtering assembly 10 comprises a backing plate 12 having a sputtering target 14 bonded thereto. Sputtering target 14 has a planar sputter surface 16. A semiconductive material wafer 18 is within the assembly 10 and provided to be spaced from sputtering surface 16 of target 14. In operation, particles or sputtered material 22 is displaced from surface 16 of target 14 and used to form a coating (or thin film) 20 on wafer 18.

Typically the target forms part of a cathode assembly in a PVD chamber that contain a process gas such as argon. The electrical field is applied between the cathode assembly and an anode in the chamber (typically the sidewall of PVD apparatus) and, as a result, the gas is ionized by collision with electrons ejected from the surface of the cathode. This generates a plasma of positively charged gas ions that are accelerated towards the negatively charged target surface. The positive gas ions impact the target and dislodge particles from the target material. Once freed from the target, these displaced (and essentially neutral) particles travel across the plasma and deposit themselves upon the wafer substrate as a thin film.

There are several important parameters that govern effectiveness of sputtering. Those include uniformity and reflectivity of deposited thin film, the number of defects (foreign particles) on substrate, deposition rate, current-voltage (I-V) characteristics during deposition and target life.

Deposition by sputtering can be non-uniform for various reasons. Plasma density can be affected by the geometry of PVD equipment. The magnetic field can change non-uniformly due to variation among the magnets, which are in motion, or in the relationship of the magnets to the target. Finding the optimal arrangement and rotational speed of magnets located behind target backside in order to influence the path taken by electrons within the sputtering chamber, to increase the rate of collisions of gas and achieve better sputtering rate and uniformity of deposited thin films, can be challenging. In some cases, temperature variation at different locations on the target as well as grain size and texture of the target material may also result in non-uniform deposition.

In general, atoms are ejected from target surface with a wide distribution of angles. However collisions with other particles and gas scattering randomize the trajectories of atoms due to small mean path of ejected metal atoms relative to the total travelled distance between target and wafer. Low pressure (high vacuum) has been therefore implemented to limit the number of collisions and reduce randomization.

Another source of non-uniform deposition comes from the changing shape of the target surface as the target gets eroded away during sputtering. This erosion profile can also be affected by magnet arrangement and movement. Conventional target designs at the beginning of life generally include a planar surface geometry at the center of the sputtering target as shown in FIG. 1. A need exists for extending target life to improve thin film uniformity.

SUMMARY OF THE INVENTION

These and other needs are addressed by the various aspects, embodiments, and configurations of the present disclosure.

Embodiments of the present disclosure include a sputtering target comprising a sputtering material and having a non-planar sputtering surface prior to erosion by use in a sputtering system, the non-planar sputtering surface having a circular shape and comprising: a central axis region having a center axis; a concave curvature feature at the central axis region, the concave curvature feature symmetrically disposed about the center axis and having a first point coincident with the center axis, the concave curvature feature corresponding to a reference, protruding convex curvature feature of an erosion profile of a reference sputtering target following erosion by use in a sputtering system for at least 1000 kWhrs and coincident with the center axis, the reference sputtering target comprising a sputtering material having an identical composition as the sputtering material of the sputtering target, the reference sputtering target further comprising a planar sputtering surface prior to erosion by use in a sputtering system; the central axis region having a wear profile after erosion by use in a sputtering system for at least 1000 kWhrs including a protuberance including a first height and a first outer circumferential wear surface having a first slope and the reference, protruding convex curvature feature including a second height and a second outer circumferential wear surface having a second slope, the protuberance providing a sputtered target having reduced shadowing relative to the reference, protruding convex curvature feature, wherein: the first height is less than the second height, the reference, protruding convex curvature feature having the second height blocking more sputtered atoms having trajectories directed radially inward toward the central axis and redepositing onto the target; and, the first slope is less steep than the second slope, the second outer circumferential wear surface having the second slope directing more sputtered atoms with trajectories radially outward relative the central axis away from a wafer.

The sputtering target according to paragraph [0016], wherein the percentage reduction between the first slope and the second slope is at least about 40 percent.

The sputtering target according to either paragraph [0016] or paragraph [0017], wherein the percentage reduction between the first slope and the second slope is from about 40 percent to about 100 percent.

The sputtering target according to any of paragraphs [0016]-[0018], the central axis region further including a total target thickness at the center axis, wherein the total target thickness is from about 10 percent to about 30 percent less than the total target thickness at the center axis for the reference sputtering target comprising the planar sputtering surface prior to erosion.

The sputtering target according to any of paragraphs [0016]-[0019], wherein the total target thickness is from about 15 percent to about 25 percent less than the total target thickness at the center axis for the reference sputtering target.

The sputtering target according to any of paragraphs [0016]-[0020], wherein the sputtering target further comprises at least one recessed groove in the surrounding region.

The sputtering target according to any of paragraphs [0016]-[0021], wherein the sputtering material includes at least one material chosen from Ti, Al, Cu, Ta, Ni, Co, Mo, Au, Ag, Pt, W, Cr, a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy.

The sputtering target according to any of paragraphs [0016]-[0022], wherein the target is monolithic.

The sputtering target according to any of paragraphs [0016]-[0023], wherein the target is diffusion bonded.

Embodiments of the present disclosure also include a method of designing a sputtering target for use in a sputtering chamber, said method comprising: forming a sputtering target having a surface profile having a concave curvature feature symmetrically about a central axis of the sputtering target; measuring a sputtered profile of the sputtering target after sputtering in a sputtering chamber for at least 1000 kWhrs; designing a revised surface profile based on the measurements of the sputtered profile to reduce shadowing at a central axis region of the sputtering target; and forming a revised sputtering target having the revised surface profile.

The method according to paragraph [0025], further including measuring a sputtered profile of a reference sputtering target after use for at least 1000 kWhrs, the reference sputtering target comprising a sputtering material having an identical composition as the sputtering material of the sputtering target, the reference sputtering target further comprising a planar sputtering surface prior to erosion by use in a sputtering system, wherein: the measured sputtered profile of the sputtering target includes a first outer circumferential wear surface having a first slope; and, the measured reference sputtering target includes a second outer circumferential wear surface having a second slope wherein the first slope is less steep than the second slope.

The method according to either paragraph [0025] or paragraph [0026], wherein the percentage reduction between the first slope and the second slope is at least about 40 percent.

The method according to any of paragraphs [0025]-[0027], wherein the steps of measuring, designing, and forming a revised sputtering target are repeated to optimize the revised surface profile.

Embodiments of the present disclosure include a sputtering target comprising a sputtering material having a non-planar sputtering surface prior to erosion by use in a sputtering system, the non-planar sputtering surface having a circular shape and comprising: a central axis region having a center axis; the central axis region including at least one non-protruding concave curvature feature symmetrically disposed about the center axis and having a first point coincident with the center axis, the at least one non-protruding concave curvature feature corresponding to a reference, protruding convex curvature feature of an erosion profile of a reference sputtering target following erosion by use in a sputtering system and coincident with the center axis, the reference sputtering target comprising a sputtering material having an identical composition as the sputtering material of the sputtering target, the reference sputtering target further comprising a planar sputtering surface prior to erosion by use in a sputtering system; a line perpendicular to the center axis and colinear with the reference sputtering target planar sputtering surface prior to erosion by use in a sputtering system; the first point at a first axial distance from the line; a surrounding region disposed about the central axis region; the surrounding region including a second point coincident with the line and at a first radial distance from the center axis; the central axis region having a wear profile after erosion by use in a sputtering system including a protuberance having a third point coincident with the center axis and at a second axial distance from the line and a fourth point at the first radial distance from the center axis and at a third axial distance from the line, wherein the third axial distance is greater than or equal to the first axial distance and to the second axial distance.

The sputtering target according to paragraph [0029], wherein the reference sputtering target has a wear profile after use including a fifth point coincident with the center axis at a fourth axial distance from the line, wherein the first axial distance and the second axial distance are greater than the fourth axial distance.

The sputtering target according to either paragraph [0029] or paragraph [0030], wherein the protuberance includes a first outer circumferential wear surface having a first slope and the reference, protruding convex curvature feature includes a second outer circumferential wear surface having a second slope, wherein the first slope is less steep than the second slope.

The sputtering target according to any of paragraphs [0029]-[0031], wherein the at least one non-protruding concave curvature feature includes an inner circumferential surface and a bottom surface including the first point.

The sputtering target according to any of paragraphs [0029]-[0032], wherein the bottom surface is flat, rounded, concave, or convex.

The sputtering target according to any of paragraphs [0029]-[0033], wherein the sputtering target has a total target radius and a total target thickness, wherein the first radial distance is from about 5 percent to about 40 percent relative to the total target radius and the first axial distance is from about 5 percent to about 50 percent of the total target thickness.

The sputtering target according to any of paragraphs [0029]-[0034], wherein the sputtering material includes at least one material chosen from Ti, Al, Cu, Ta, Ni, Co, Mo, Au, Ag, Pt, W, Cr, a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy.

BRIEF DESCRIPTION OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

DETAILED DESCRIPTION

Figure 1:
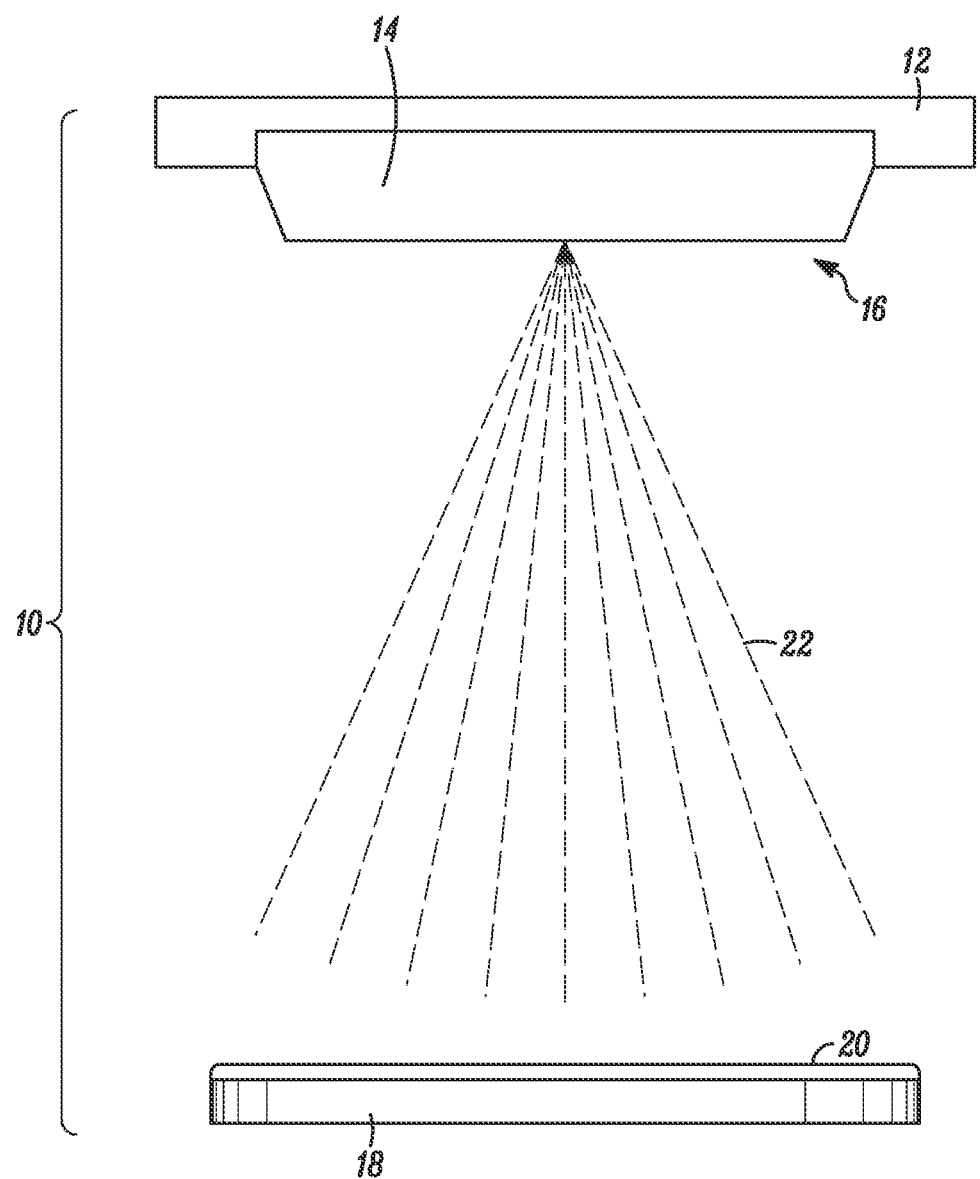
FIG. 1 is a schematic view illustrating of a portion of an exemplary physical vapor deposition apparatus 10.

Physical vapor deposition ("PVD") methodologies are used extensively for forming thin films of material over a variety of substrates. Various metals and alloys can be deposited using PVD technology, including for example Al, Ti, Cu, Ta, Ni, Mo, Au, Ag, Pt and alloys of these elements. In one PVD process, known as sputter deposition or sputtering, particles are ejected from the surface of a sputtering target by bombardment with gas ions, such as plasma. Thus, the sputtering target is the source for particles, which are deposited onto a substrate, such as a semiconductor wafer. As the target is eroded during sputtering use, the surface geometry is altered. Changes in target surface geometry lead to difficulties depositing a uniform thin film by sputtering and such wear limits target life.

Previously, problems related to depositing uniform thin films and/or extending target life have been addressed in various ways. Those include: i) increase of distance between target and wafer to allow only certain atoms with a specific ejection angle to reach the wafer; ii) use of a filtering device also called a collimator or flux optimizer; to select only atoms with specific trajectories; iii) use of magnet with new design, arrangement and movement; iv) application of a RF bias at the wafer which enables a build of negative charge at wafer and force metal ions to deposit at angles close to wafer normal. All the above solutions have limitations. For example, increasing the distance between the target source and the substrate or using a collimator is less inefficient and leads to more waste of ejected atoms stuck in chamber or on the walls of collimator. Also application of a radio-frequency (RF) bias might result in electrical stress to the wafer components.

The most recent systems that use a collimator and/or new magnet design and movement also encounter problems. For the example of using a collimator as in the prior art, as shown schematically in FIG. 2, there is a decrease in thin film uniformity through life (or equally an increase in non-uniformity). Typically, from beginning of life (BOL) to end of life (EOL) of a sputtering target, deposition is characterized by a thinning at the center of the wafer compared to the edges. It is at least in part due to the change in target erosion profile at the target center 14a at BOL to the target center 14b at EOL. This affects the direction at which atoms are ejected from the sputtering target through life relative to the location of collimator walls 24. For the example of using new magnet design and movement, there is a degradation of I-V sputtering characteristics. Specifically voltage follows two trends with increasing target life: i) an increase in voltage due to the change in spacing between the eroding target profile and magnet; in effect, the target surface becomes closer on average to the magnet located near the target backside; and, ii) an increase in voltage fluctuations caused as the magnet moves between the in and out positions under the regions of target with deeper or shallower erosion grooves. As life increases, the target erosion profile becomes less uniform, which exacerbates the local differences in voltage.

Embodiments of the present disclosure address the problem of depositing uniformly thin films by addressing the target center profile and proposing new geometries for sputtering targets at the central area of the target. According to the present disclosure, the initial (i.e. before sputtering) target surface is strategically modified at the center of the target. The center of the target strategically modified is referred to interchangeably herein as a central region, a central axis region, a modified central axis region, and a modified profile including a central axis region. Sputtering is sensitive to target shape and surface profile. Electric field distribution in the vicinity of the plasma discharge depends on target shape and/or surface profile, because the target profile represents a boundary condition for the magnetic and electric fields that are described by known laws of electromagnetism. As a result, target shape will influence the local strength and distribution of the electromagnetic field lines that in turn govern deposition rate and orientation of ejected atoms.

Moreover the mutual influence and interaction between a sputtering target and electromagnetic field evolves constantly during target life because the profile of target surface changes as material is being eroded away. This results in an ongoing re-distribution of the local strength of electromagnetic field and causes a change in the direction of sputtered atoms.

Figure 3:
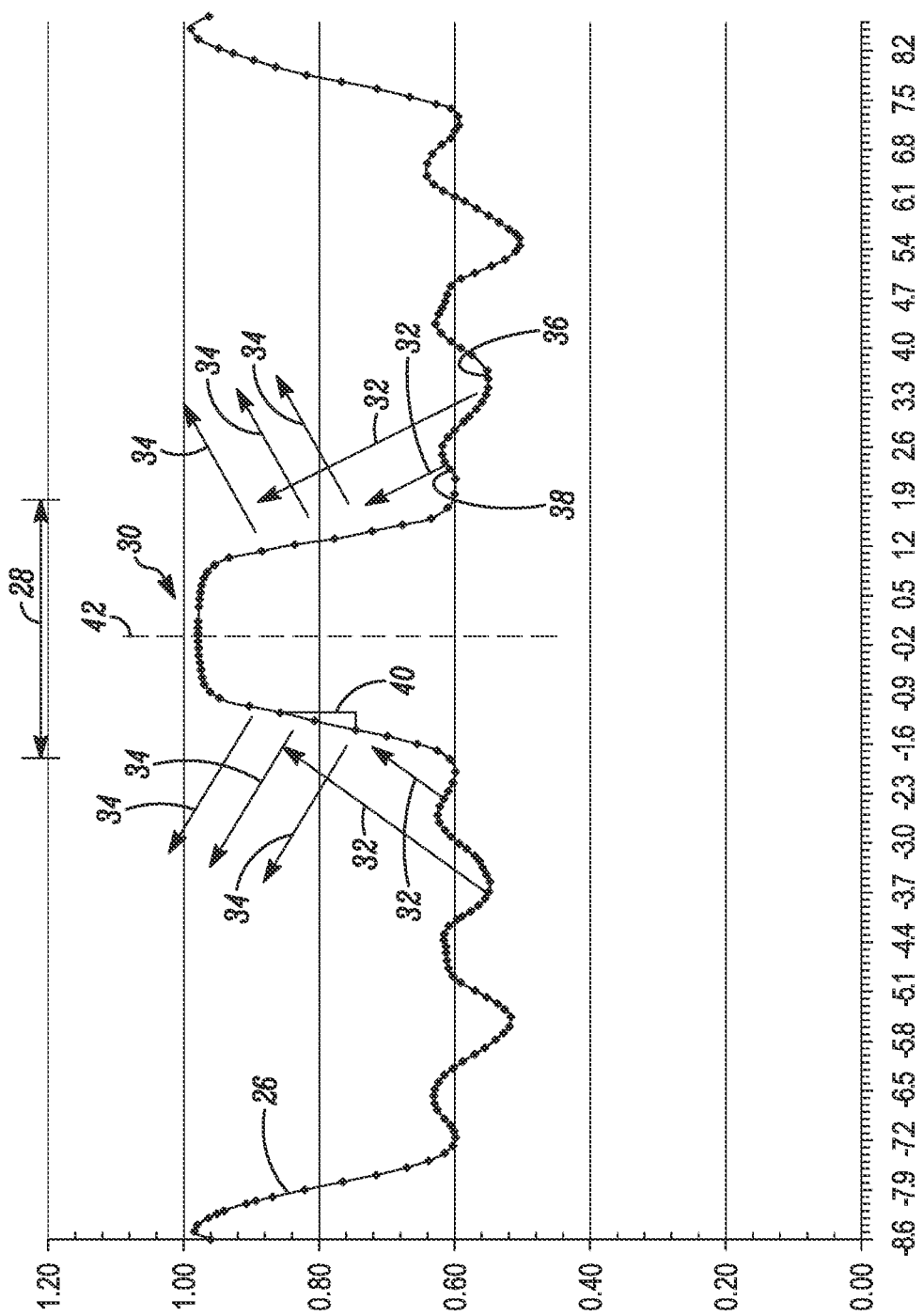
FIG. 3 is a surface profile of a prior art sputtering target after about 2000 kWhrs use.

It was discovered that over a sputtering target's lifetime, mechanisms contributing to the thinning of film deposited at the center of the wafer are impacted or affected at least in part to the center of the target having locally eroded very little during use and corresponding to a low sputtering rate in the center. As a consequence, a conventional planar (i.e., flat or non-profiled surface) 300 mm target having a thickness of 25.4 mm (1 inch) and a radius of 221 mm (8.7 inches) retains almost the same height at the center, whereas the erosion in a surrounding region near the center, but typically at least about 25 to about 50 mm (1 to 2 inches) away from the center, are typically high and result in a deep eroded groove in the target at the end of life. For example, grooves of about 7.6 mm to about 12.7 mm (0.3-0.5 inches) in depth may be present at the end of life. An illustrative end of life erosion profile 26 of a 300 mm sputtering target having an initially flat or planar surface is shown in FIG. 3. As shown, the erosion profile 26, also referred to as wear profile, of the target has a prominent protuberance (also referred to as a hump or a bump) 30 at the central region 28 after about 2000 kWhrs use. The central region 28 has a radius of about 50 mm (2 inches). A 300 mm target herein refers to the wafer size onto which the target sputters.

The protuberance 30 develops throughout a target's lifetime. The central bump 30, having a height of about 10 mm (0.4 inches) or about 40% of original target thickness disadvantageously blocks at least some atoms during sputtering such as those having a trajectory represented by a first set of arrows 32, because their trajectory crosses the central profile. This results in undesirable redeposition of atoms to the central area of the target. Most affected are those atoms dislodged from the surrounding area adjacent to protuberance 30, corresponding to the bottom 36 or side 38 of an erosion groove.

As central bump 30 is being formed by erosion, the slope 40 of the central bump 30 increases in steepness with further sputtering use as illustrated in the erosion profile 26 of FIG. 3. As a result, at least some atoms, represented by a second set of arrows 34, sputter in a direction away from axis 42 rather than in a direction toward the wafer as would from the original planar target surface in the central region. Therefore atoms traveling in the direction of the second set of arrows 34, which should have reached the wafer center area from the original target surface, are now sputtered toward the side of the wafer substrate. Trajectories 32 and 34 are undesirable in sputtering.

Figure 2:
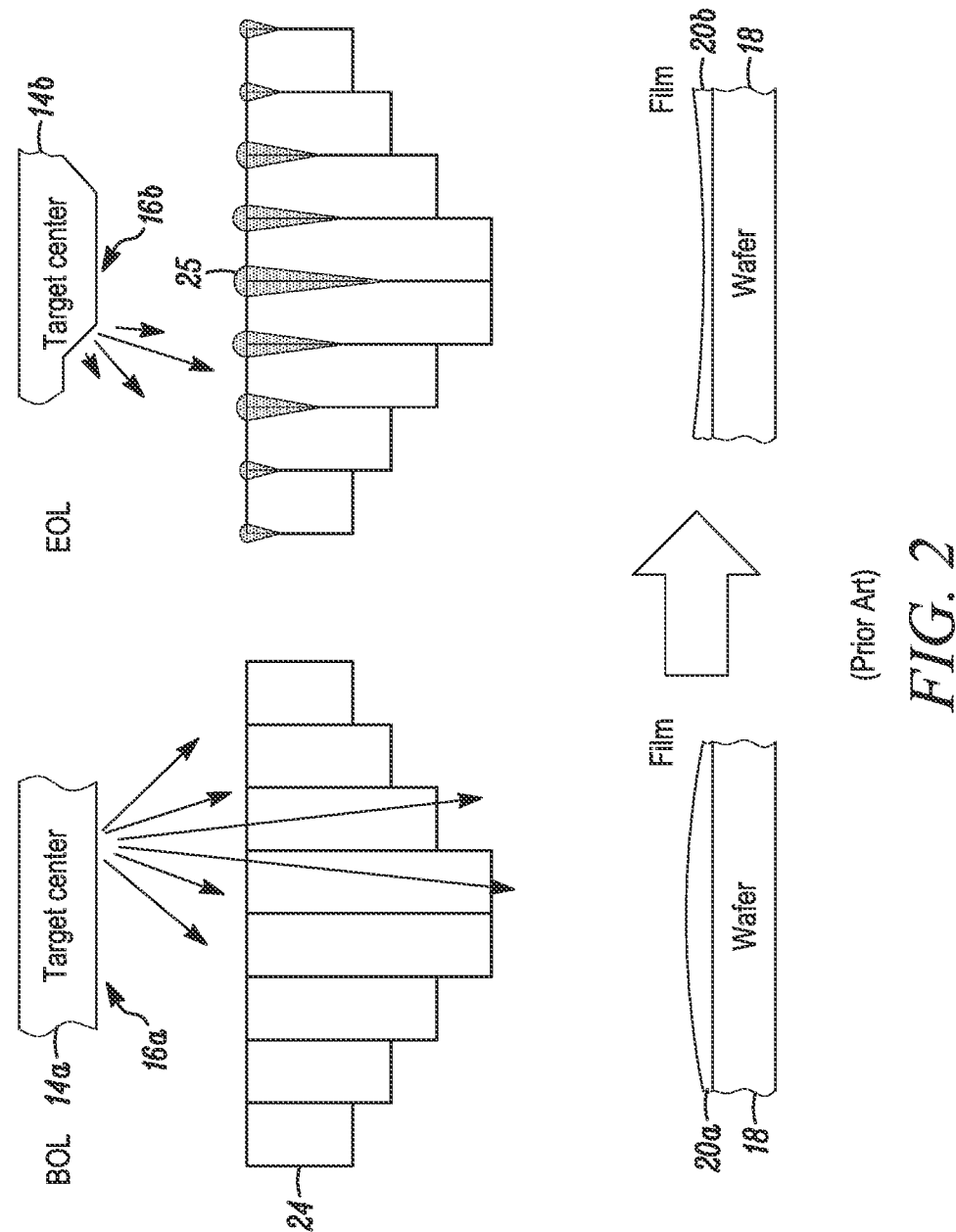
FIG. 2 is a schematic view illustrating systems using a collimator as in the prior art shown at beginning of target life (BOL) and at end of target life (EOL).

Moreover, the local geometrical relation and spacing between target surface and the collimator, referring again to FIG. 2 showing target surface 16a at the beginning of target life and surface 16b at the end of target life, changes the most in areas of profile having the biggest difference between the local maximum and minimum in erosion. This difference is the highest near the central bump and results in more atoms having a change in sputtering direction between the beginning and end of life; as a result, a larger proportion of atoms are observed to be captured in the central portion 25 of collimator 24 as shown in FIG. 2. Therefore, at least those atoms captured by the collimator and adhering to the collimator walls do not reach wafer and contribute to wafer thinning.

Figure 4A:
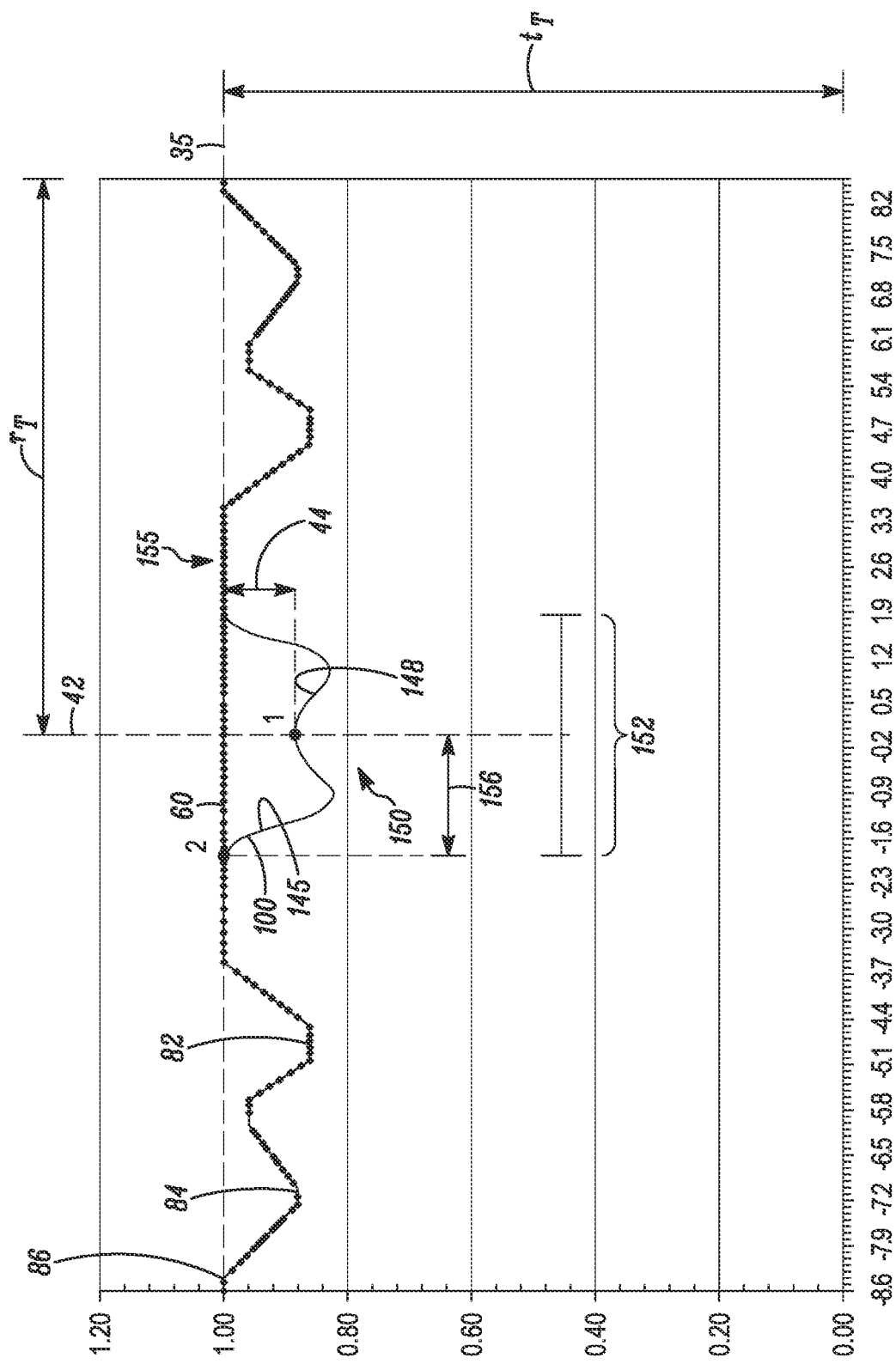
FIG. 4A is a profile at BOL for a sputtering target having a modified profile at the central region of the target according to an embodiment of the present disclosure.
Figure 4B:
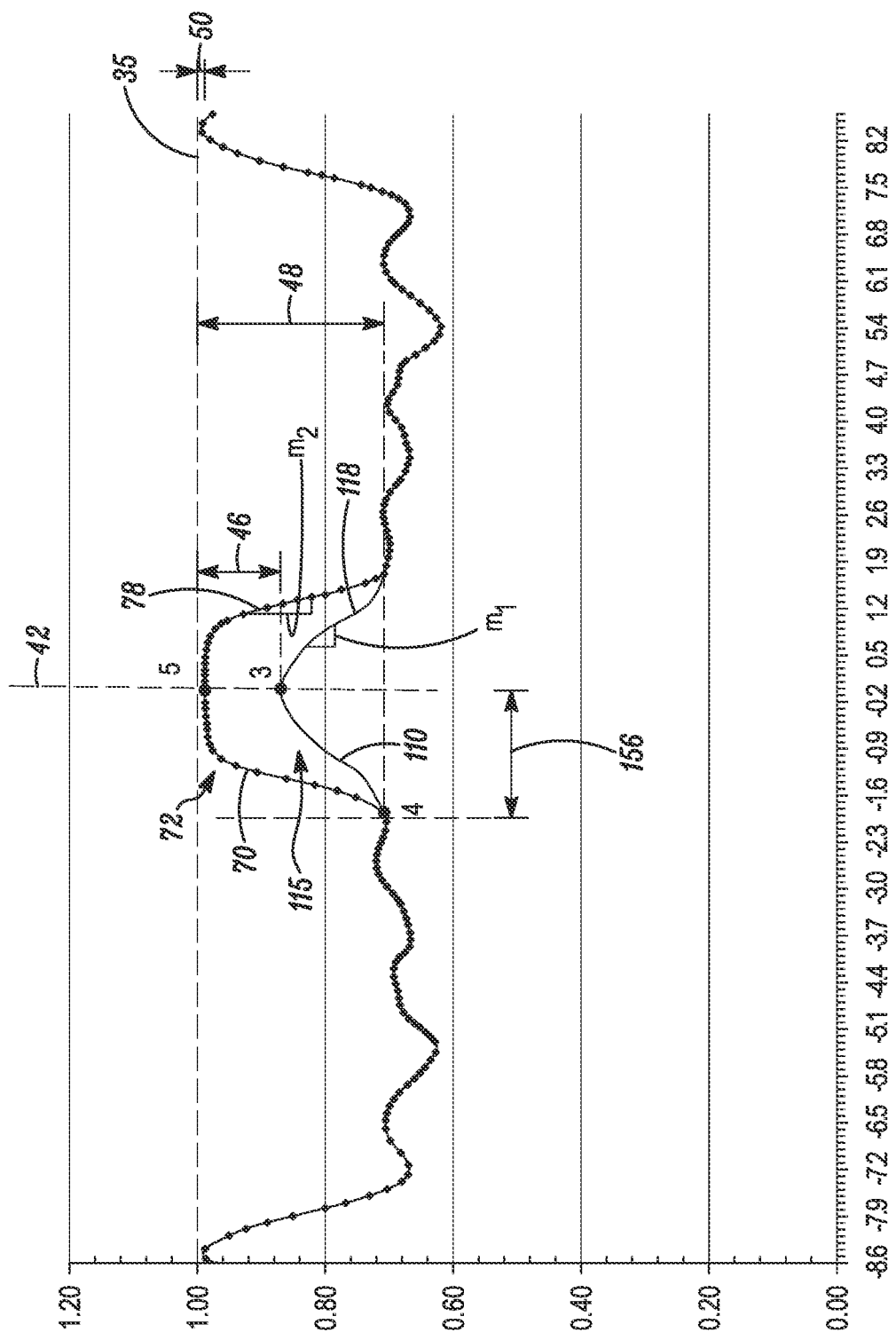
FIG. 4B is a surface profile of the sputtering target of FIG. 4A after about 1500 kWhrs sputtering use.

To solve the problem of wafer thinning, at least some embodiments of the present disclosure modify the profile of the central region of the target. Referring to FIGS. 4A and 4B, the target is modified at the central region in such a way that: a) the central bump of the comparative erosion profile at end of life is smaller in height and b) the slope on both sides of the central bump at the end of life is not as steep as compared with a reference target. In at least some embodiments, this is accomplished by making a cavity 150, also referred to interchangeably herein as a "concave curvature" or "concave feature", in the central portion of the target profile 100 of FIG. 4A. Profile 60 is a reference profile made of the same target material but having a planar profile at the central region. Note that modified target profile 100 and reference target profile 60 are different in the central portion as shown but are overlapping or coincident in the remaining portion, that is, at radial distance greater than about ±58.4 mm (about 2.3 inches). For a 25.4 mm (1 inch) thick target, the depth di for the cavity can vary between about 1.3 mm and about 12.7 mm (about 0.050 inch and about 0.5 inch). In other words, the cavity depth can be from about 5 percent to about 50 percent of the total target thickness, or from about 10 percent to about 30 percent of the total target thickness, or from about 15 percent to about 20 percent of the total target thickness. For example, in FIG. 4A, the cavity 150 has a maximum depth di of 4.6 mm (about 0.18 inch). The radius in absolute value where the central part is modified depends on a specific initial target profile, target source material, and dimensions. Typically the modified central region includes a radius ranging from about 1.27 mm to up to about 89 mm (from about 0.050 inch to up to about 3.50 inches) for a target with an overall target radius of 221 mm (8.7 inch). In FIG. 4A, the maximum radius $r_{max}$ where the central target profile is changed is about 58.4 mm (about 2.3 inch) for example. In other words, the cavity radius can be from 5 percent to about 40 percent relative to the total target radius, or from 20 percent to about 30 percent relative to the total target radius, or from about 23 percent to about 27 percent relative to the total target radius. The specific profile of the cavity can vary but is mostly determined by the central shape of erosion profile at the end of life as is shown in FIG. 4B.

FIG. 4B illustrates the modified profile 110 corresponding to profile 100 of FIG. 4A after about 1500 kWhrs sputtering use according to embodiments of the present disclosure. Profile 110 after 1500 kWhrs corresponds to a near end of life, which is about 2000 kWhrs for a conventional target. For comparison the profile 70 is shown in FIG. 4B for the reference target (having the initially planar central profile 60) is illustrated. Notably, profile 110 is similar to reference profile 70 after 1500 kWhrs except in the central region wherein the protuberance 120 of profile 110 is significantly less pronounced than the protuberance 80 of reference profile 70, both in width and height.

Figure 5:
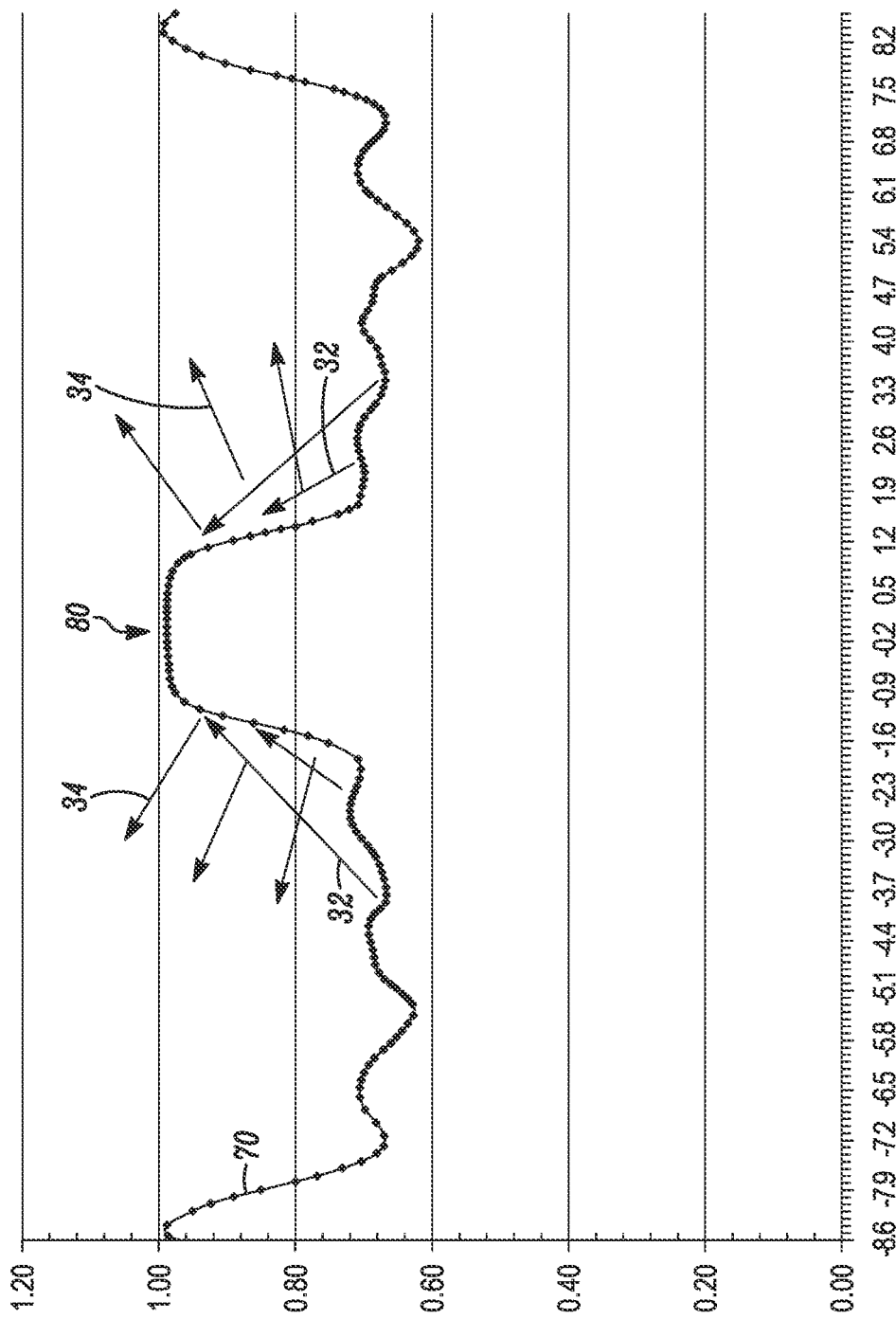
FIG. 5 is a surface profile of a prior art sputtering target after 1500 kWhrs use.
Figure 6:
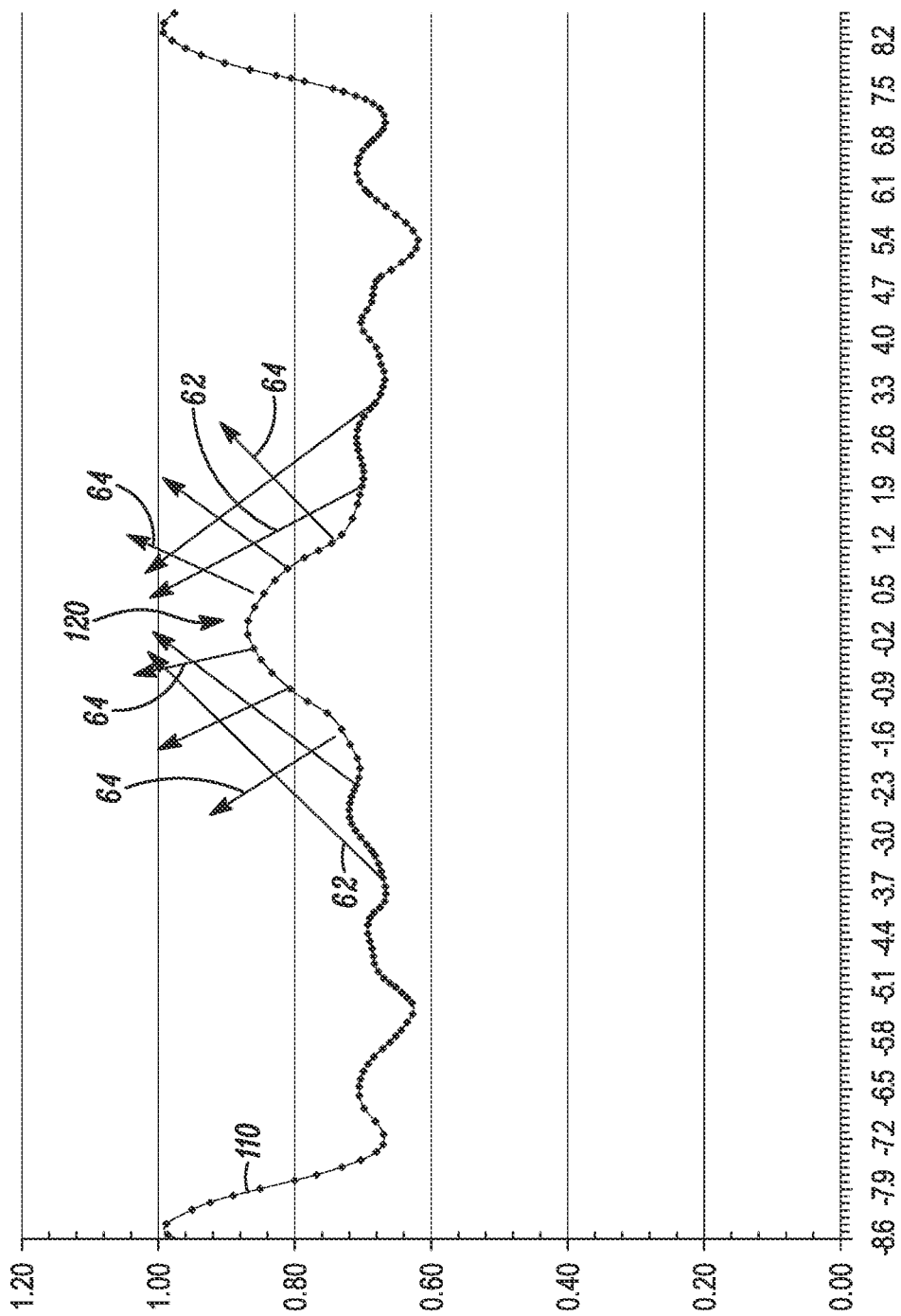
FIG. 6 is a surface profile of a sputtering target having a modified profile at the central region after about 1500 kWhrs use.

The benefits of using modified profile 100 of FIG. 4A on the trajectory of sputtered atoms after 1500 kWhrs use is shown schematically in FIG. 6. The reference target profile after use is illustrated in FIG. 5 for comparison. As shown in FIG. 5 for the prior art reference target profile 70 after 1500 kWhrs, the atoms include problematic trajectories, as represented by arrows 32 and 34, including redeposited atoms and atoms directed away from the central area of the wafer (heading deferentially to the sides of the wafer) as similarly discussed for FIG. 3. This is due to the prominent protuberance 80 blocking desired trajectories that would lead the atoms from the central region of the target to the central region of the wafer. In contradistinction, FIG. 6 shows the modified profile 110 after 1500 kWhrs wherein the protuberance 120, being smaller in both height and width, does not block desired trajectories, as represented by arrows 62 and 64, so that the sputtered atoms from the central region of the target are directed to the central region of the wafer. In other words, the modified profile 100 including cavity 150 disposed in the central region (as shown in FIG. 4A) provides two beneficial effects on the trajectory of central sputtered atoms as life of the target progresses: (a) fewer atoms are hindered in their trajectory by the central bump 120 (of FIG. 4B and FIG. 6) because bump 120 is not as high and wide as compared with the reference protuberance 80 (of FIG. 4B and FIG. 5) resulting in a higher number of atoms likely to reach the center of wafer; and, (b) the shape of central bump 120 changes the overall distribution of sputtered atoms and the angular direction of their trajectories, in other words sputtered atoms leaving the bump area 120 are directed more toward the center of the wafer due to the less steep slope on each side of the central bump resulting in more vertically oriented ejection of central atoms and leading to a higher proportion of central atoms passing through a flux collimator. Both of these effects reduce wafer thinning at the center and promote more uniform deposition onto the wafer leading to improved wafer film uniformity at the end of life.

Referring again to FIGS. 4A, 4B and 6, according to embodiments of the present disclosure, a sputtering target comprises a sputtering material having a non-planar sputtering surface prior to erosion by use in a sputtering system. The non-planar sputtering surface has a circular shape and comprises a central axis region 152 having a center axis 42. The central axis region 152 includes at least one non-protruding concave curvature feature 150 symmetrically disposed about center axis 42 and having a first point, point 1, coincident with the center axis. The at least one non-protruding concave curvature feature 150 corresponds to a reference, protruding convex curvature feature 72 of an erosion profile 70 of a reference sputtering target following erosion by use in a sputtering system and coincident with center axis 42, the reference sputtering target comprising a sputtering material having an identical composition as the sputtering material of the sputtering target, the reference sputtering target further comprising a planar sputtering surface 60 prior to erosion by use in a sputtering system. Line 35 is perpendicular to center axis 42 and is colinear with the reference sputtering target planar sputtering surface 60 prior to erosion by use in a sputtering system. Point 1 is at a first axial distance 44 from line 35. A surrounding region 155 is disposed about the central axis region 152, in other words the surrounding region is further from center axis 42 and is non-overlapping with central axis region 152. Surrounding region 155 includes a second point, point 2, coincident with line 35 and at a first radial distance 156 from center axis 42. The central axis region 152 has a wear profile 110 after erosion by use in a sputtering system including a protuberance 115 having a third point, point 3, coincident with center axis 42 and at a second axial distance 46 from line 35 and a fourth point, point 4, at the first radial distance 156 from center axis 42 and at a third axial distance 48 from line 35, wherein third axial distance 48 is greater than or equal to first axial distance 44 and to second axial distance 46.

Reference sputtering target having wear profile after use 70 includes a fifth point, point 5, coincident with center axis 42 at a fourth axial distance 50 from line 35, wherein first axial distance 44 and second axial distance 46 are greater than fourth axial distance 50. Protuberance 115 includes first outer circumferential wear surface 118 having slope $m_1$ and the reference, protruding convex curvature feature 72 after erosion includes a second outer circumferential wear surface 78 having slope $m_2$, wherein $m_1$ is less steep than $m_2$. In at least some embodiments of the present disclosure, the non-protruding concave curvature feature 150 includes an inner circumferential surface 145 and a bottom surface 148 including point 1. Bottom surface 148 can be flat. Alternatively, bottom surface 148 can be rounded, concave, or convex. In other examples, bottom surface 148 can be pointed or angular (not shown).

The non-protruding concave curvature feature 150 of the sputtering target has a total target radius and a total target thickness. The shape and dimensions of the non-protruding concave curvature feature can vary. In some embodiments, the first radial distance 156 is from about 5 percent to about 40 percent relative to the total target radius and the first axial distance 44 is from about 5 percent to about 50 percent of the total target thickness. In other embodiments, the first radial distance 156 is from about 20 percent to about 30 percent relative to the total target radius and the first axial distance 44 is from about 10 percent to about 30 percent of the total target thickness. In yet other embodiments, the first radial distance 156 is from about 23 percent to about 27 percent relative to the total target radius and the first axial distance 44 is from about 15 percent to about 20 percent of the total target thickness.

Sputtering targets according to embodiments of the present disclosure may further comprise at least one recessed groove in the surrounding region, for example grooves 82 and/or 84 as shown in FIG. 4A. The surrounding region can include the region between the central axis region 152 reaching out to radial edge 86 of the target.

Referring again to FIGS. 4A, 4B and 6, according to embodiments of the present disclosure, a sputtering target comprising a sputtering material and having a non-planar sputtering surface prior to erosion by use in a sputtering system, the non-planar sputtering surface having a circular shape and comprising a central axis region 152 having a center axis 42. The central axis region 152 includes a concave curvature feature 150 symmetrically disposed about the center axis 42 and having a first point, point 1, coincident with the center axis 42. Concave curvature feature 150 corresponds to a reference, protruding convex curvature feature 72 of an erosion profile 70 of a reference sputtering target following erosion by use in a sputtering system for at least 1000 kWhrs and coincident with the center axis 42, the reference sputtering target comprising a sputtering material having an identical composition as the sputtering material of the sputtering target, the reference sputtering target further comprising a planar sputtering surface 60 prior to erosion by use in a sputtering system. Central axis region 152 has a wear profile 110 after erosion by use in a sputtering system for at least 1000 kWhrs including a protuberance 115. Protuberance 115 includes a first height, which is shown on FIG. 4B as the distance 48 less the distance 46. Protuberance 115 further includes a first outer circumferential wear surface 118 having a first slope $m_1$. The reference, protruding convex curvature feature 72 includes a second height, which is shown on FIG. 4B as the distance 48 less the distance 50. Reference, protruding convex curvature feature 72 further includes a second outer circumferential wear surface 78 having a second slope $m_2$. Protuberance 115 provides a sputtered target having reduced shadowing relative to the reference, protruding convex curvature feature 72, as illustrated in FIGS. 5 and 6. The first height (distance 48 less distance 46 on FIG. 4B) is less than the second height (distance 48 less distance 50 on FIG. 4B), because the reference, protruding convex curvature feature 72 having the second height blocks more sputtered atoms having trajectories directed radially inward toward the central axis 42 and redepositing onto the target. Also shown, the first slope $m_1$ is less steep than the second slope $m_2$, so that the second outer circumferential wear surface 78 directs more sputtered atoms with trajectories radially outward relative the central axis 42 away from a wafer. Sputtering material includes at least one material chosen from Ti, Al, Cu, Ta, Ni, Co, Mo, Au, Ag, Pt, W, Cr, a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy. In some embodiments, the target is monolithic as is known in the art. In other embodiments, the target is diffusion bonded as is known in the art. The percentage reduction between the slope of the outer circumferential wear surface of the inventive target of the present disclosure (e.g. first slope $m_1$ as in FIG. 4B) and the slope of the outer circumferential surface of the reference target (e.g. second slope $m_2$ as in FIG. 4B) in at least some of the embodiments of the present invention is at least about 40 percent. In other embodiments, the percentage reduction between the slope of the outer circumferential wear surface of the inventive target of the present disclosure and the slope of the outer circumferential surface of the reference target is at least about 45 percent, or at least about 50 percent, or at least about 55 percent, or at least about 60 percent, or at least about 65 percent, or at least about 70 percent, or at least about 75 percent, or at least about 80 percent, or at least about 85 percent, or at least about 90 percent, or at least about 95 percent. In at least some embodiments, the percentage reduction between the first slope and the second slope is from about 40 percent to about 100 percent. In these and other embodiments of the present disclosure, the central axis region 152 further includes a total target thickness at the center axis 42 in the central axis region 150 of the target prior to sputtering use, shown on FIG. 4A as distance $t_T$ less distance 44, which is less than the total target thickness $t_T$ of the reference target having a planar surface at the central axis region. In some embodiments, the total target thickness of the inventive target is from about 10 percent to about 30 percent less than the total target thickness at the center axis for the reference sputtering target comprising the planar sputtering surface prior to erosion. In other embodiments, the total target thickness is from about 15 percent to about 25 percent less than the total target thickness at the center axis for the reference sputtering target. In yet other embodiments, the total target thickness is about 18 percent to about 22 percent less than the total target thickness at the center axis for the reference sputtering target. In some embodiments, the sputtering target further comprises at least one recessed groove in the surrounding region 155.

Figure 7:
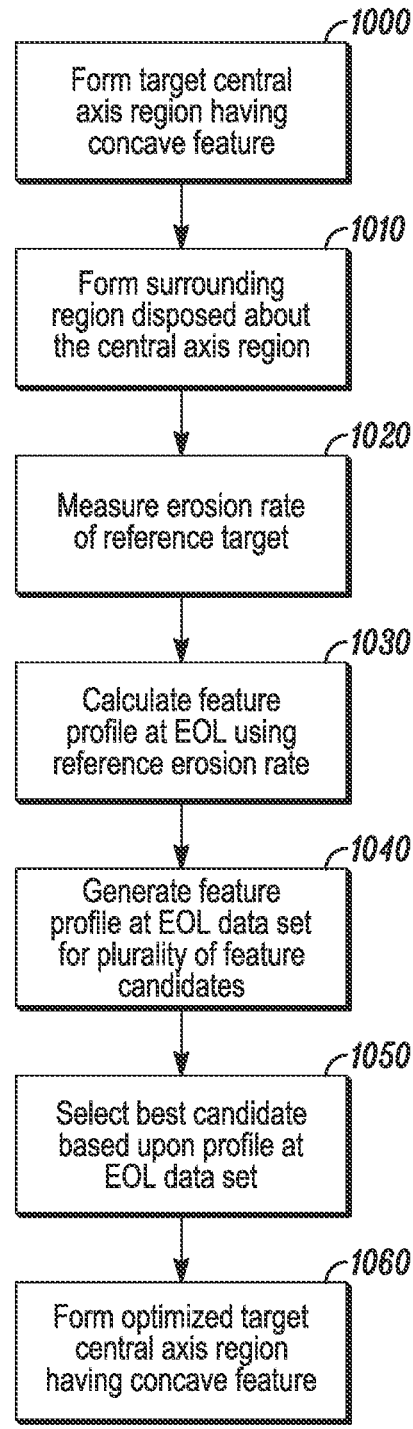
FIG. 7 is a flow diagram illustrating a method for forming a target including a modified central axis region according to an embodiment of the present disclosure.

At least some embodiments of the present disclosure include a method as illustrated in the flow diagram of FIG. 7 for forming a target including a modified central axis region. The method can be tailored to a specific target configuration and source material as desired. A method of manufacturing a sputtering target comprising a sputtering material having a non-planar sputtering surface prior to erosion by use in a sputtering system, the non-planar surface having a circular shape, comprises the steps as shown if FIG. 7. In step 1000, the target is formed having a central axis region. The central axis region includes a non-protruding concave curvature feature symmetrically disposed about a center axis and having a first point (point 1 of FIG. 4A) coincident with the center axis, wherein the at least one non-protruding concave curvature feature corresponds to a reference, protruding convex curvature feature of an erosion profile of a reference sputtering target following erosion by use in a sputtering system and coincident with the center axis. The reference sputtering target comprises a sputtering material having an identical composition as the sputtering material of the sputtering target, and the reference sputtering target further comprises a planar sputtering surface prior to erosion by use in a sputtering system. The first point at a first axial distance from a line perpendicular to the center axis and colinear with the reference sputtering target planar sputtering surface prior to erosion by use in a sputtering system. Step 1010 includes forming a surrounding region disposed about the central axis region; the surrounding region including a second point (point 2 of FIG. 4A) coincident with the line and at a first radial distance from the center axis. The method further includes optimizing the first axial distance and the first radial distance. In step 1020, the rate of erosion for a corresponding central axis region and a corresponding surrounding region for the reference sputtering target is measured. In other words, the rate of erosion through life at various radii along the profile is measured and recorded experimentally by sputtering a reference target through full life of the target. In at least some embodiments, measurements are taken in about 2.54 mm (0.100 inch) increments from edge to edge of the target surface. In step 1020, the erosion rate through life of any potential new candidate profile is assumed to be similar to that of prior art target. This assumption remains acceptable to a first degree especially for the central area of a target where sputtering is low for most target designs. The potential new candidate and reference target are made of the same material or alloy. Step 1030 includes calculating an erosion profile at end of life for the non-protruding concave curvature feature based upon said rate of erosion as determined in step 1020. Calculating as in step 1030 may further include calculating a plurality of erosion profiles at end of life for a plurality of non-protruding concave feature candidates to generate a profile data set as in step 1040. The best candidate as selected from the plurality of non-protruding concave feature candidates based on the profile data set, as in step 1050, is used to form the optimized target central axis region having a concave feature including a point coincident with a center axis as in step 1060. According to embodiments of the method, the sputtering target can have a total target radius and a total target thickness, wherein the first radial distance is from about 5 percent to about 40 percent relative to the total target radius and the first axial distance is from about 5 percent to about 50 percent of the total target thickness. In other embodiments, the first radial distance is from about 20 percent to about 30 percent relative to the total target radius and the first axial distance is from about 10 percent to about 30 percent of the total target thickness. In yet other embodiments, the first radial distance is from about 23 percent to about 27 percent relative to the total target radius and the first axial distance is from about 15 percent to about 20 percent of the total target thickness.

Materials suitable for sputtering targets according to embodiments of the present disclosure include pure elements and alloys. For example, suitable sputtering materials for a sputtering target include at least one material chosen from Ti, Al, Cu, Ta, Ni, Co, Mo, Au, Ag, Pt, W, Cr, a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy. In some embodiments, for targets made of a single element, such as materials chosen from elemental Ti, Al, Cu, Ta, Ni, Co, Mo, Au, Ag, Pt, W, and Cr, the sputtering target is substantially pure or pure. Substantially pure means nearly pure or at least 99.9% by weight elemental content. For example, a suitable sputtering material for a sputtering target can include at least one substantially pure material chosen from Ti, Al, Cu, Ta, Ni, Co, Mo, Au, Ag, Pt, W, and Cr. In other embodiments, the sputtering material of the sputtering target is an alloy. An alloy includes a main element mixed with at least one other element from the periodic table, wherein the sputtering material contains a higher quantity of the main element than the one or more elements with which it is mixed. According to standard naming convention, an alloy may be referenced as an alloy of the main element. For example, an alloy in which the main element is Al is referenced as an Al alloy. Suitable sputtering materials for a sputtering target can include at least one main element chosen from Ti, Al, Cu, Ta, Ni, Co, Mo, Au, Ag, Pt, W, and Cr. Such materials may be referred to as a Ti alloy, an Al alloy, a Cu alloy, a Ta alloy, a Ni alloy, a Co alloy, a Mo alloy, a Au alloy, a Ag alloy, a Pt alloy, a W alloy, and a Cr alloy, respectively.

In step 1020, a plurality of varying profiles at the central region is designed representing candidate designs. Step 1020 further includes predicting the profile at the central region for the candidate designs at a plurality of life stages (progressively relating to time of use in kWhrs) for the plurality of varying profiles using reference calculations for the a corresponding plurality of life stages for the reference target as determined by the experimental measurements of erosion rate as a function of time of use as determined in step 1000. In step 1030, the predicted profiles over life for candidate designs are evaluated and the best candidate design is selected based on the dimensions and shape of the central part of profile toward the end of life. In addition, step 1040 optionally includes modeling of the interactions between the local electromagnetic field and the target surface to ascertain the angle distribution of sputtered atoms at the target center.

Advantageously, and according to at least some embodiments of the present disclosure, modified profiles having a central region cavity are useful with either monolithic target designs or diffusion bonded target designs.

In some embodiments, the sputtering targets including a non-protruding concave curvature feature according to the present disclosure are monolithic. In other words, sputtering targets having a central region cavity may be formed from one single piece. These targets are referred to interchangeably herein as monolithic and/or monoblock assemblies. Monolithic designs, being composed of a single material, can provide better control of electro-magnetic properties including voltage variations within a sputtering target.

In other embodiments according to the present disclosure, sputtering targets are coupled or attached to a backing plate by, for example, diffusion bonding. At least some embodiments of the present disclosure include wherein the target is diffusion bonded. The sputtering target may further comprise a backing plate. Use of a backing plate as with the diffusion bonded targets can provide support for the sputtering target during the sputtering process to advantageously reduce, for example, warping of the sputtering target over the life of the target. One non-limiting example of a method of attaching a sputtering target to a backing plate is hot isotactic pressing ("HIPing," or "hipping"). Hipping may be used to diffusion bond the sputtering target to a backing plate by pressing the sputtering target and backing plate together after heating to a hipping temperature. Targets made of Ti are examples of diffusion bonded targets having a central region cavity. In the case of diffusion bonded designs, the backing plate material is different than the core target material and thus may have different electro-magnetic and other physical properties such as CTE, electrical resistivity, and thermal conductivity. These differences between the core and backing plate materials can exacerbate local voltage differences. Therefore, backing plate selection must be carefully taken into account electro-magnetic and physical properties to complement those of the target core material. Typically, controlling and predicting local fluctuations during erosion in diffusion bonded designs is more challenging as compared to monolithic designs. The sputtering target may further comprise a backing plate comprising a grooved flange, wherein the grooved flange may further be recessed to provide, for example, cooling.

For both monolithic designs and for backing plate designs, the target material may be processed, for example with a thermo-mechanical (TMP) process, to enhance the strength of the target. For example, Al, Al alloys, Cu and Cu alloys, which have a low strength when grain size is large (typically 30-100 microns), may be processed with TMP process to increase the strength of the material.

One particularly effective TMP process is Equal Channel Angular Extrusion (ECAE), techniques of which are disclosed in U.S. Pat. Nos. 5,850,755, 7,191,630, and 7,767,043, which are incorporated herein by reference in their entirety. According to at least some embodiments of the present disclosure, ECAE can be used advantageously to impart severe plastic deformation in bulk pieces of metals and alloys and give additional strength to those materials. ECAE is an extrusion technique, which consists of two channels of roughly equal cross-section meeting at a certain angle, where the angle ranges between from about 90° to about 140°. In one embodiment, the angle is 90°. Under conditions providing good lubrication of billet and walls, uniform simple shear deformation occurs layer by layer at the intersecting plane between the two channels. The main process characteristics of ECAE are (i) high deformation per pass (at 90°, true strain is 1.17); (ii) multi-pass ECAE can reach extreme levels of deformation without changing the shape and volume of the billet after each pass; (iii) rotation or flipping of the billet between each pass can achieve various strain paths to control grain shape and crystallographic texture. Two main mechanisms for strengthening during ECAE are herein described. Firstly, refinement of structural units, for example cells, sub-grains and grains, to submicron levels. This is also referred to as Hall Petch strengthening:

$$\sigma_y = \sigma_0 + \frac{k_y}{\sqrt{d}}$$

where $\sigma_y$ is the yield stress, $\sigma_o$ is a materials constant for the starting stress for dislocation movement (or the resistance of the lattice to dislocation motion), $k_y$ is the strengthening coefficient (a constant specific to each material), and d is the average grain diameter. Based on this equation, strengthening becomes particularly effective when grain diameter d is less than 1 micron. The second main mechanism for strengthening during ECAE is the presence of a plurality of dislocations within the cells, sub-grains, and grains due to high strain.

Other effective TMP processes to impart strength in materials include hardening steps by conventional methods such as rolling, drawing, extrusion or forging that are performed in materials after a recrystallization heat treat step. In some embodiments of the present disclosure, hardening yields targets having a central region cavity having an average grain size in the range from about 30 microns to about 100 microns; such targets include Al alloys and Cu alloys and practically achievable strength is in the intermediate range between a low strength fully recrystallized material and a high strength submicron ECAE material. For some Al and especially Cu alloys as well as harder materials such as Ti, Ta, Co, Cr, W, Ni such as a solution can offer sufficient strength for a monolithic design.

In general, a high strength material, such as for example obtained via ECAE, is especially advantageous in monolithic design because a stronger material can be sputtered deeper and therefore longer. For example, depending on design, life of 200 mm/300 mm monolithic targets can be typically extended by 20%-100% compared to standard diffusion bonded targets when using ECAE materials.

High strength ECAE materials with submicron grain structures and, to a lesser extent, of conventionally hardened materials can provide a reduction of voltage fluctuations. These reductions in voltage fluctuations can include a reduction of Eddy currents due to a slightly higher electrical resistivity. This contributes positively in the reduction of voltage fluctuations, plasma instabilities and DC power faults. Further, reductions in voltage fluctuation can include a better resistance against target warping through life, a phenomenon that increases with life. Less warping allows a better consistency of the distance between the magnet and the erosion profile thru life, which in turn is directly related to local voltages. Therefore, a better control of voltage fluctuations can be obtained. Furthermore one should also note that the usage of a central region cavity in the target profile according to at least some of the embodiments of the present disclosure weakens the overall mechanical strength of a target assembly. Promoting a higher strength in target material becomes therefore even more important and beneficial in order to limit target deflection.

In at least some of the embodiments of the present disclosure, various geometries of the backside of target assembly are suitable. For example, the backside of the target assembly may include channels, which improve cooling efficiency and contributes in a reduction of target deflection. Another advantage of features such as channels at the target backside is a reduction of Eddy currents, which also helps decrease plasma instabilities.

At least some embodiments of the present disclosure are illustrated by the following non-limiting examples.

Figure 8:
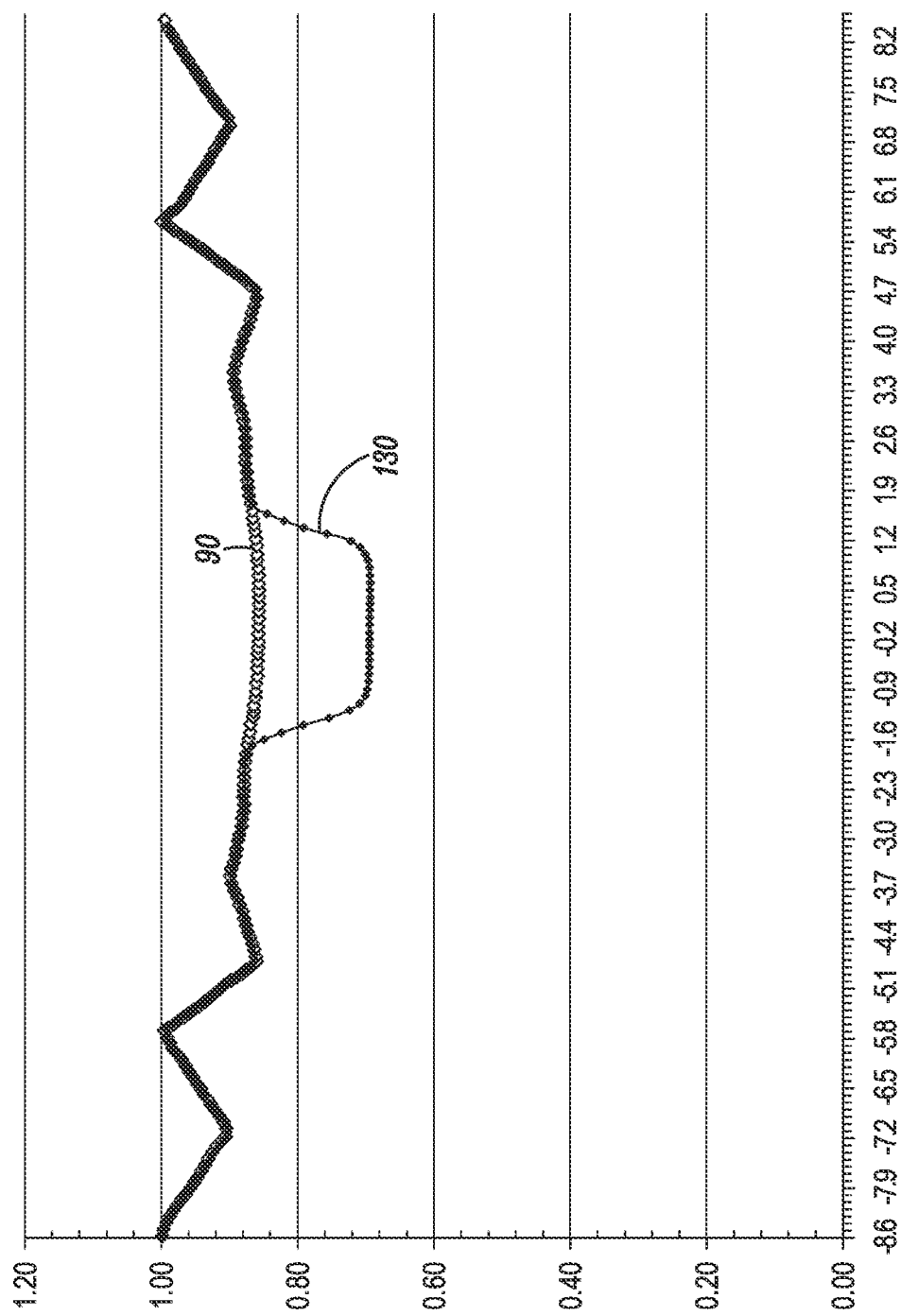
FIG. 8 illustrates a sputtering target having a modified profile according to an embodiment of the present disclosure.

Example 1: FIG. 8 is the beginning of life surface profile for a reference target (profile 90) and a target having a modified profile (profile 130), which includes a central cavity region according at least some embodiments of the present disclosure. The reference target and the target having the modified profile were both 300 mm Cu alloy monolithic targets having the same composition and were subjected to the same ECAE processing conditions. The targets differed in the surface profiles. The central portion of profile 130 has a 4.57 mm (0.18 inch) deep cavity within radii+/−58.4 mm (2.3 inch). The total target thickness for the target having profile 130 is 17.8 mm (0.7 inch), which is an 18.9% reduction in thickness as compared with the target having reference profile 90. The target having profile 130 used a monolithic design configuration with a high strength sub-micron ECAE Cu alloy to allow for providing mechanical stability. The standard reference profile 90, without modification at the central region is also shown for comparison.

The profile 130 target reached 3,950 kWhrs, which represents an additional 450-650 kWhrs in life as compared to a ECAE Cu alloy monolithic target having the profile 90 that runs typically up to 3300-3500 kWhrs. One reason for this substantial life extension is improved film uniformity. Without being bound by theory, it is believed that profile 130 modified in the central region allowed more atoms to reach the central portion of wafer wherein the trajectories of the sputtered atoms were not hindered by the excessive protuberance of the standard target.

The life improvement for target having profile 130 as compared the life for a standard diffusion bonded target for same chamber configuration is around 2200-2400 kWhrs, thereby showing target life extended by about 65% to about 80%.

Figure 9:
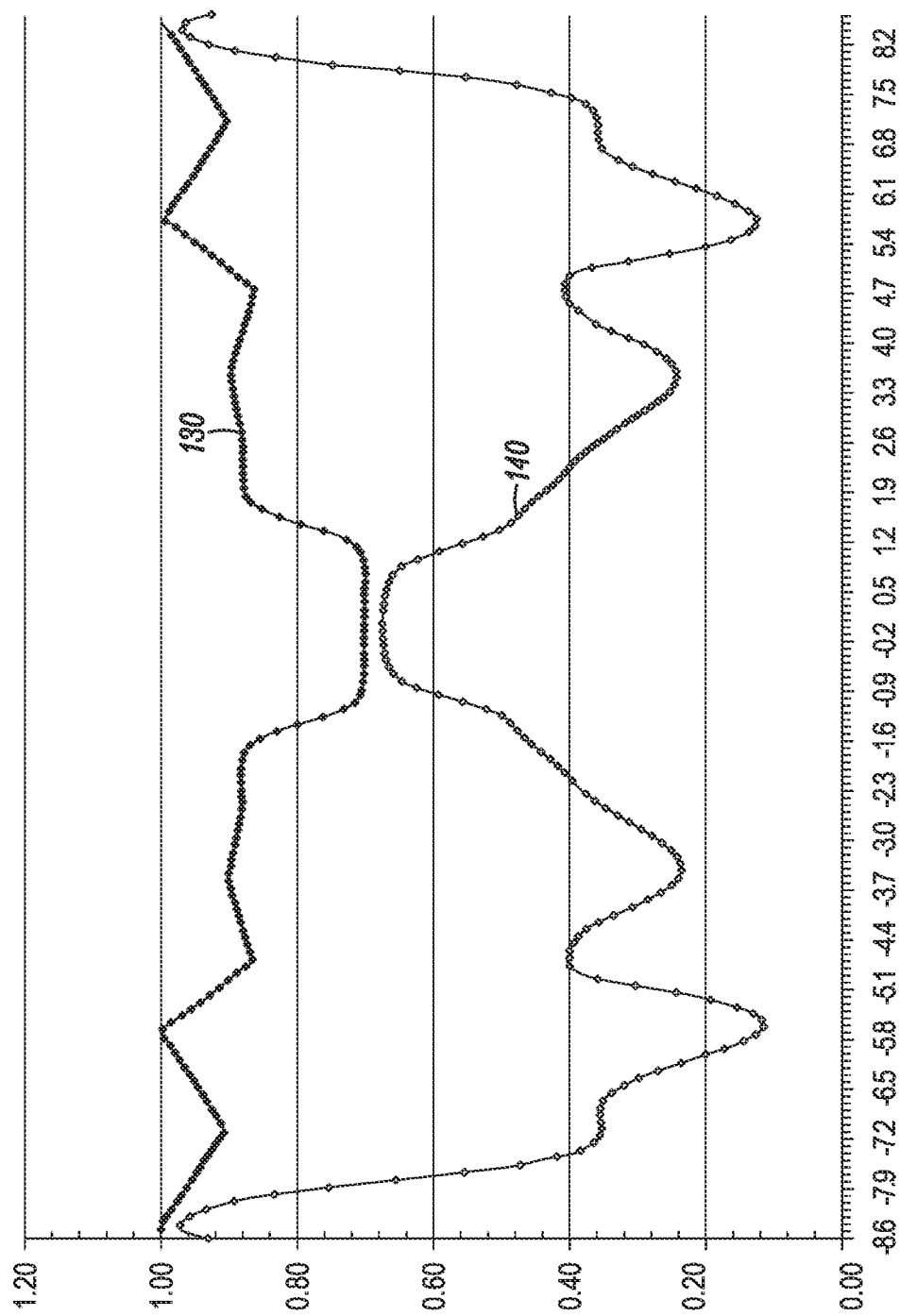
FIG. 9 illustrates the surface profile of the sputtering target of FIG. 8 before and after 3950 kWhrs sputtering use according to an embodiment of the present disclosure.

The erosion profiles before and after sputtering are illustrated in FIG. 9 as profile 130 and profile 140 respectively. Profile 140 was recorded after 3950 kWhrs sputtering use. The deepest erosion area sputtered 89% of the target thickness, i.e. only about 2.79-3.05 mm (0.11-0.12 inch) was left at the deepest groove. This represents close to the maximum achievable limit for target life for this design. Even for this near optimal case with extended life, the overall target warping was low with a maximum of 0.69 mm (0.027 inch) toward magnet and no evidence of contact between the target and the magnet was found.

Figure 10A:
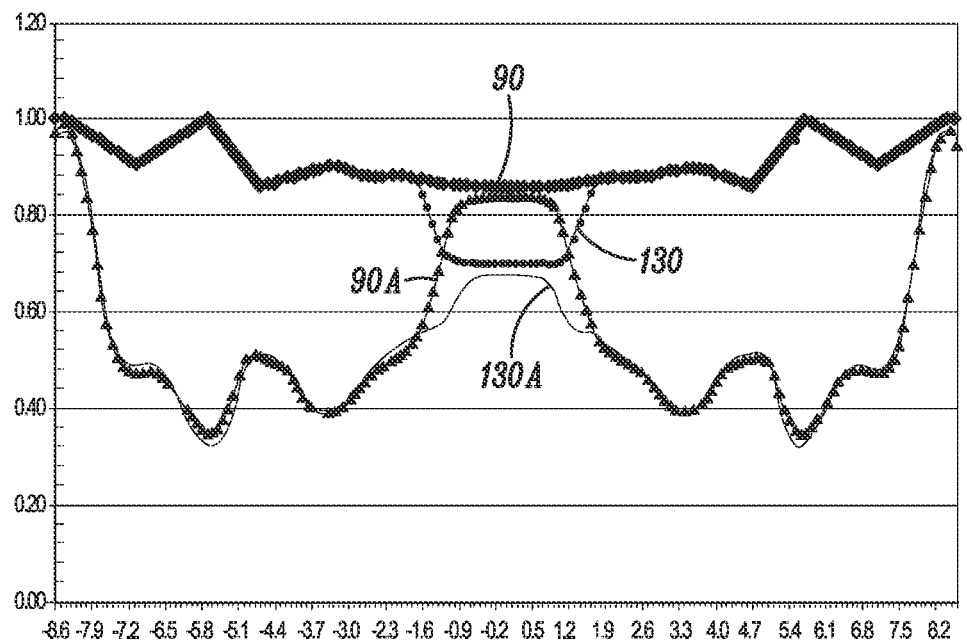
FIG. 10A illustrates the surface profile of a reference target and a modified profile as shown in FIG. 8 and comparative surface profiles of same after 3000 kWhrs sputtering use.
Figure 10B:
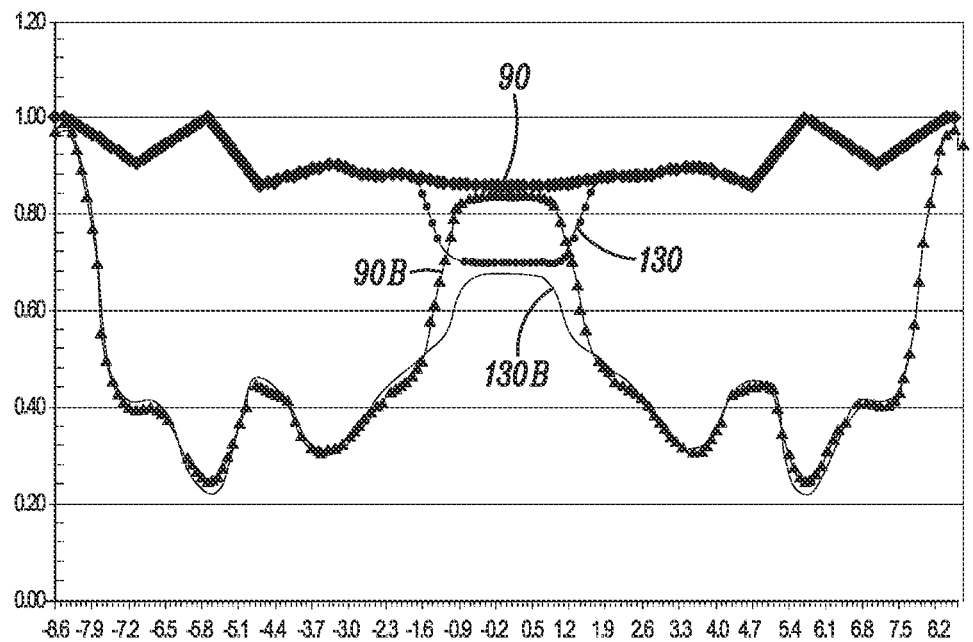
FIG. 10B illustrates the surface profile of a reference target and a modified profile as shown in FIG. 8 and comparative surface profiles of same after 3500 kWhrs sputtering use.
Figure 10C:
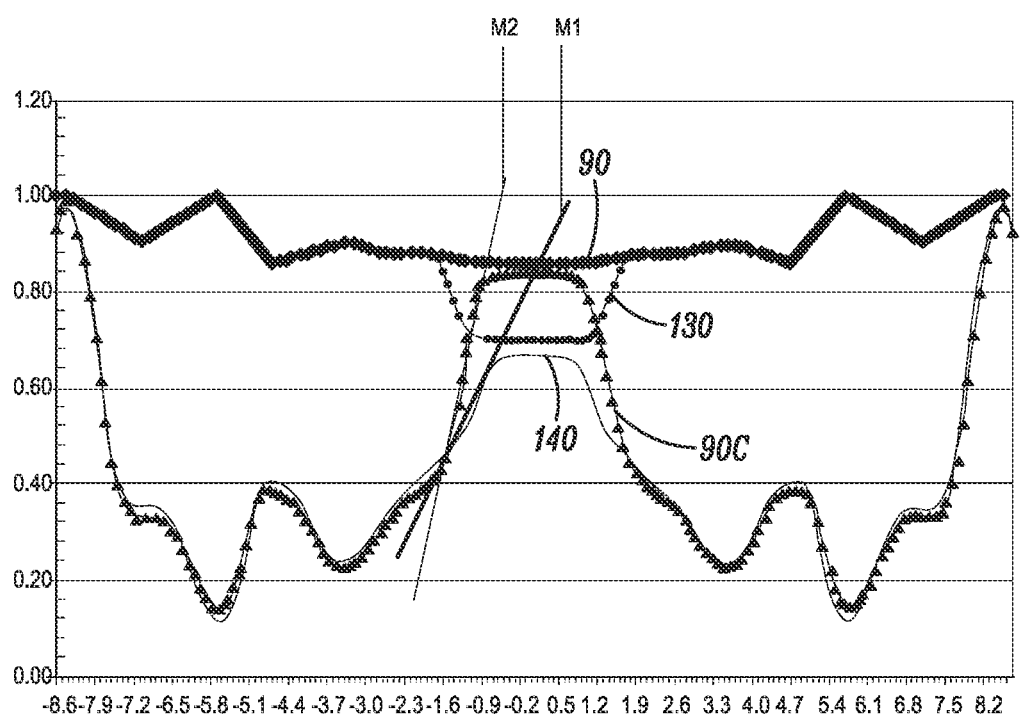
FIG. 10C illustrates the surface profile of a reference target and a modified profile as shown in FIG. 8 and comparative surface profiles of same after 3950 kWhrs sputtering use.

FIGS. 10A-10C illustrates the evolution of profiles for the reference and modified targets at various times in life for the targets as shown in FIG. 8 having reference profile 90 and modified profile 130 at beginning of life (BOL). FIG. 10A illustrates reference profile 90 target at BOL (0 kWhrs) and corresponding profile 90A after 3000 kWhrs; and modified profile 130 target at BOL (0 kWhrs) and corresponding profile 130A after 3000 kWhrs of sputtering. FIG. 10B illustrates reference profile 90 target at BOL (0 kWhrs) and corresponding profile 90B after 3500 kWhrs; and modified profile 130 target at BOL (0 kWhrs) and corresponding profile 130B after 3500 kWhrs of sputtering. FIG. 10C illustrates reference profile 90 target at BOL (0 kWhrs) and corresponding profile 90C after 3950 kWhrs; and modified profile 130 target at BOL (0 kWhrs) and corresponding profile 140 after 3950 kWhrs of sputtering. As the targets having BOL profile 90 (reference) and profile 130 (modified according to Example 1) erode, there are differences in height and slope for the central cavity region. As illustrated in FIG. 10C, the slope M2 of profile 90C is steeper than the slope M1 of profile 140, each slope taken after 3950 kWhrs of sputtering. Table 1 includes data for the slopes, M1 and M2, calculated at various times of life including at 2500, 3000, 3500, and 3950 kWhrs. The slope of the profile 130 target was significantly reduced from about −43% to about −50% as compared with the slope of the profile 90 reference target at sputtering times ranging from 2500 to 3950 kWhrs.

TABLE 1

Slopes for Reference Profile 90 Target and Modified Profile 130 Target at Various Times of Sputtering Life

| Life (kWhrs) | Slope of profile 90 target (M2) | Slope of profile 130 target (M1) | % reduction in slope between M1 and M2 [(M1 − M2)/M2] | Ratio (M1/M2) |
|---|---|---|---|---|
| 2500 | 0.294 | 0.153 | −48% | 0.52 |
| 3000 | 0.355 | 0.176 | −50% | 0.50 |
| 3500 | 0.417 | 0.225 | −46% | 0.54 |
| 3950 | 0.472 | 0.270 | −43% | 0.57 |

Figure 11A:
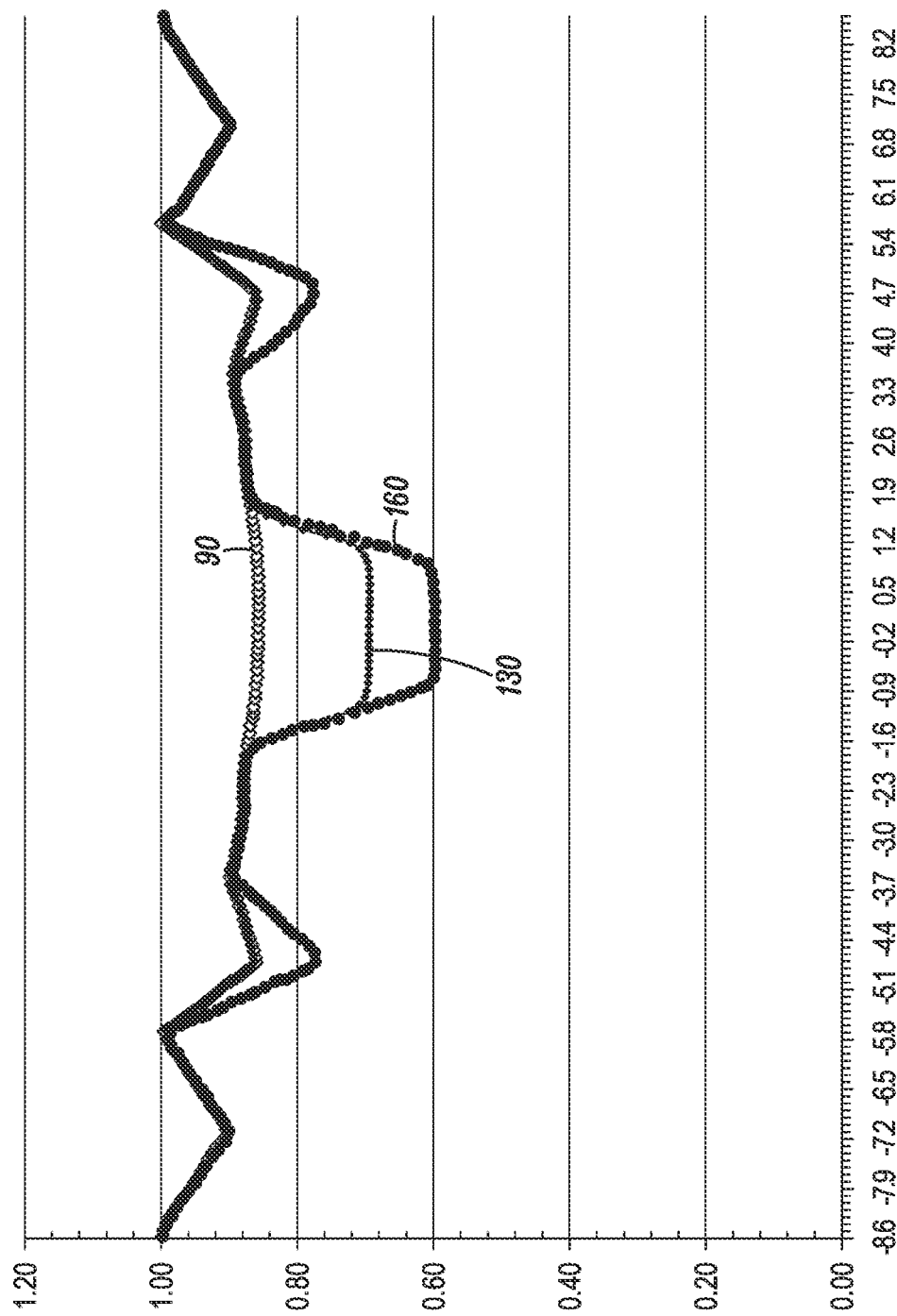
FIG. 11A illustrates the surface profiles of sputtering targets having modified profiles according to an embodiment of the present disclosure and a prior art profile before sputtering use.
Figure 11B:
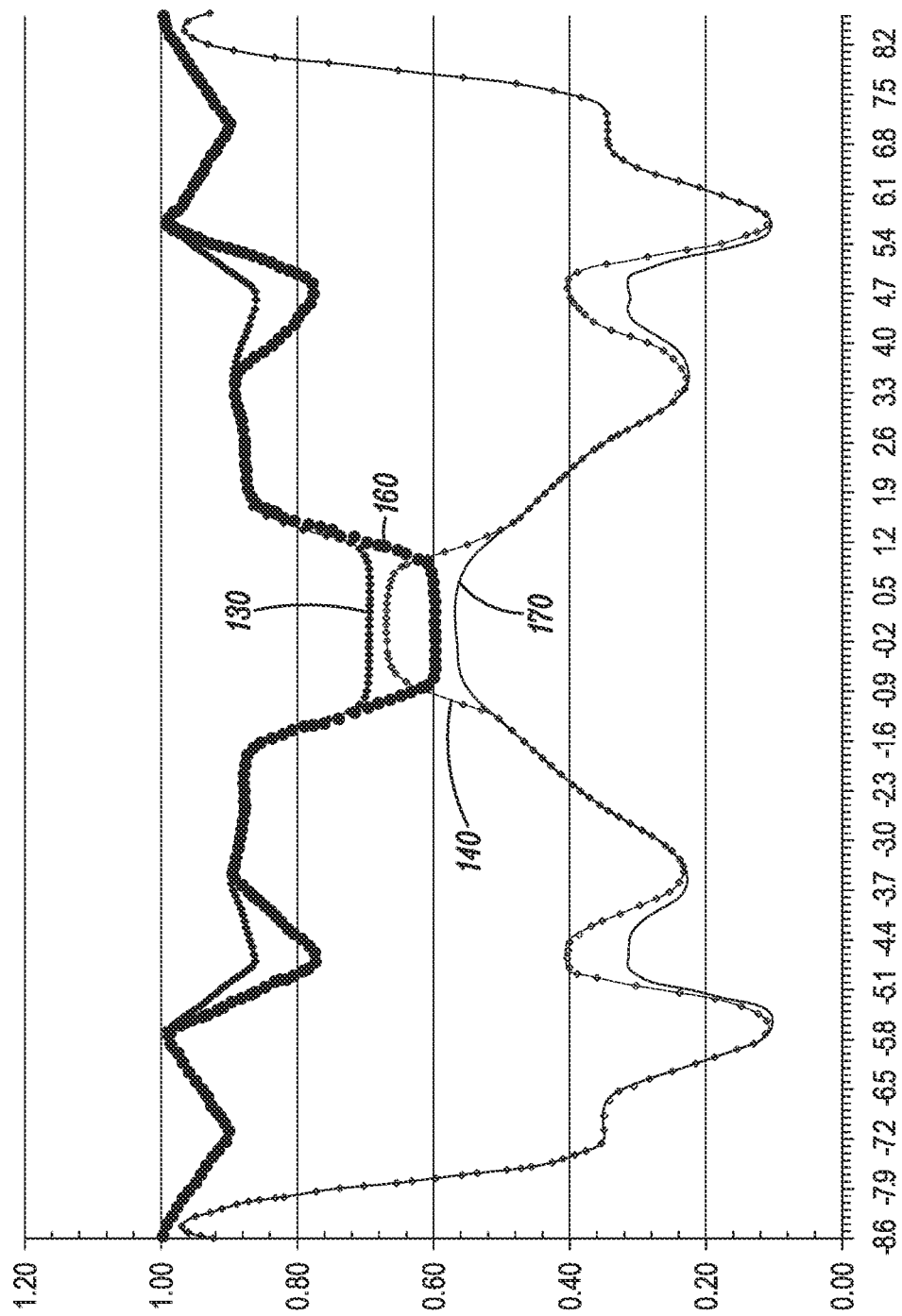
FIG. 11B illustrates the surface profiles of the sputtering targets of FIG. 10A before and after 3950 kWhrs sputtering use.

Example 2: A 300 mm Cu alloy target having a modified profile including a central cavity region according at least some embodiments of the present disclosure is provided as profile 160 as shown in FIG. 11A before sputtering and as profile 170 after 3950 kWhrs in FIG. 11B. Compared to the profile 130 described in Example 1, the profile 160 includes at least one modification in the central region in that profile 160 includes a deeper central cavity of about 7.6 mm (about 0.3 inch). Profile 160 also includes a change in profile between radii 88.9 and 139.7 mm (3.5 and 5.5 inch) and by symmetry between −88.9 and −139.7 mm (−3.5 and −5.5 inch).

Figure 12A:
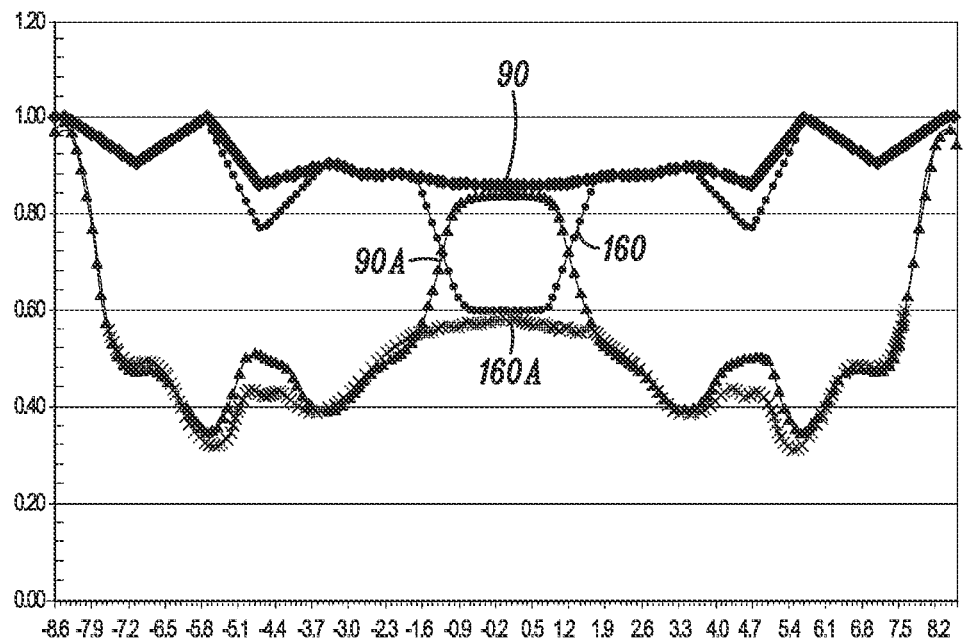
FIG. 12A illustrates the surface profile of a reference target and a modified profile as shown in FIG. 11A and comparative surface profiles of same after 3000 kWhrs sputtering use.
Figure 12B:
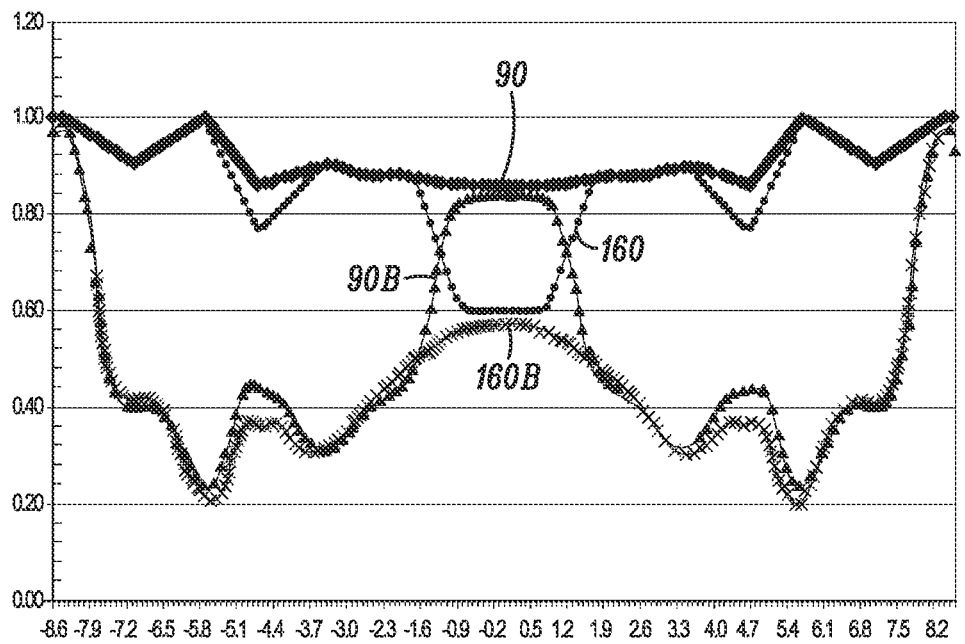
FIG. 12B illustrates the surface profile of a reference target and a modified profile as shown in FIG. 11A and comparative surface profiles of same after 3500 kWhrs sputtering use.
Figure 12C:
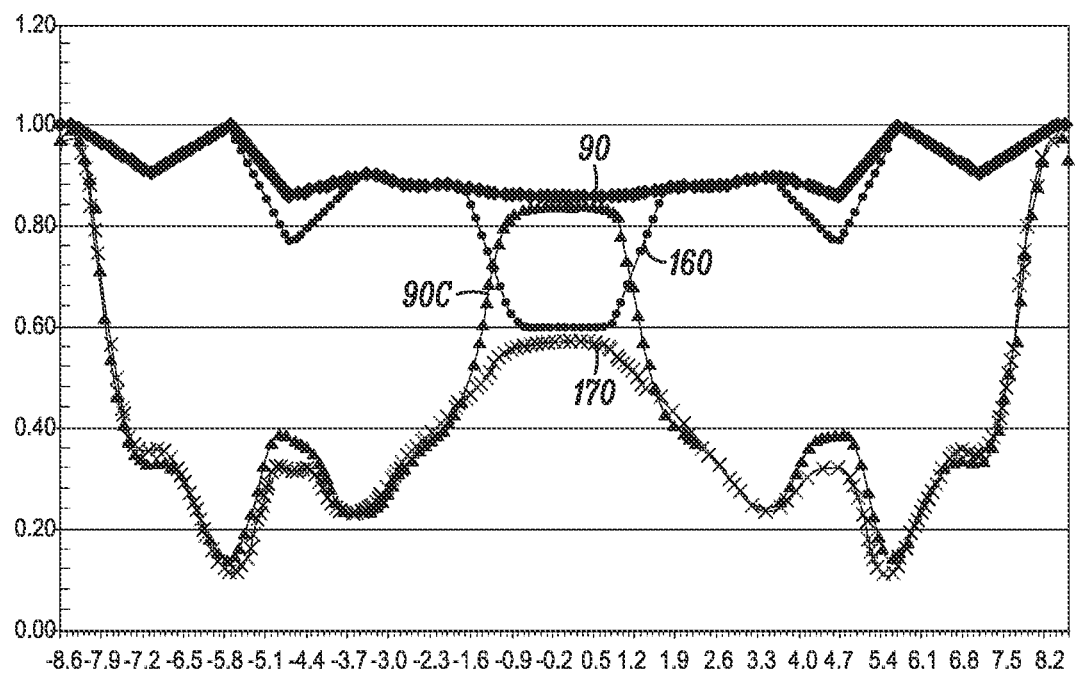
FIG. 12C illustrates the surface profile of a reference target and a modified profile as shown in FIG. 11A and comparative surface profiles of same after 3950 kWhrs sputtering use.

FIGS. 12A-12C illustrates the evolution of profiles at various times in sputtering life for the targets having reference profile 90 and modified profile 160 at beginning of life (BOL). FIG. 12A illustrates reference profile 90 target at BOL (0 kWhrs) and corresponding profile 90A after 3000 kWhrs; and modified profile 160 target at BOL (0 kWhrs) and corresponding profile 160A after 3000 kWhrs of sputtering. FIG. 12B illustrates reference profile 90 target at BOL (0 kWhrs) and corresponding profile 90B after 3500 kWhrs; and modified profile 160 target at BOL (0 kWhrs) and corresponding profile 160B after 3500 kWhrs of sputtering. FIG. 12C illustrates reference profile 90 target at BOL (0 kWhrs) and corresponding profile 90C after 3950 kWhrs; and modified profile 160 target at BOL (0 kWhrs) and corresponding profile 170 after 3950 kWhrs of sputtering. As the targets having BOL profile 90 (reference) and profile 160 (modified according to Example 2) erode, there are differences in height and slope for the central cavity region. Table 2 includes data for the slopes, M2 and M3, calculated at various times of life including at 3000, 3500, and 3950 kWhrs. The slope of the profile 160 target was dramatically reduced from about −77% to about −96% as compared with the slope of the profile 90 reference target at sputtering times ranging from 3000 to 3950 kWhrs.

TABLE 2

Slopes for Reference Profile 90 Target and Modified Profile 160 Target at Various Times of Sputtering Life

| Life (kWhrs) | Slope of profile 90 target (M2) | Slope of profile 160 target (M3) | % reduction in slope between M3 and M2 [(M3 − M2)/M2] | Ratio (M3/M2) |
|---|---|---|---|---|
| 3000 | 0.355 | 0.015 | −96% | 0.04 |
| 3500 | 0.417 | 0.064 | −85% | 0.15 |
| 3950 | 0.472 | 0.108 | −77% | 0.23 |

Profile 160 provides an even thicker film at target center at the end of life, which is believed to result in a better wafer film uniformity at the end of life, than profile 130. This is due to the reduction in height of the central bump as well as the absence of steep slope on each side of central bump for profile 170 as compared with profile 140.

Also the new profile 160 provides a better resistance against voltage fluctuations and ultimately DC power faults. As shown in FIG. 10B, the new profile reduces the height of the locally less eroded area at radius between 88.9 and 139.7 mm (3.5" and 5.5") in absolute value at the end of life. This in effect decreases the difference in height between that location and the adjacent areas that have more erosion and results in less voltage variations.

Figure 13:
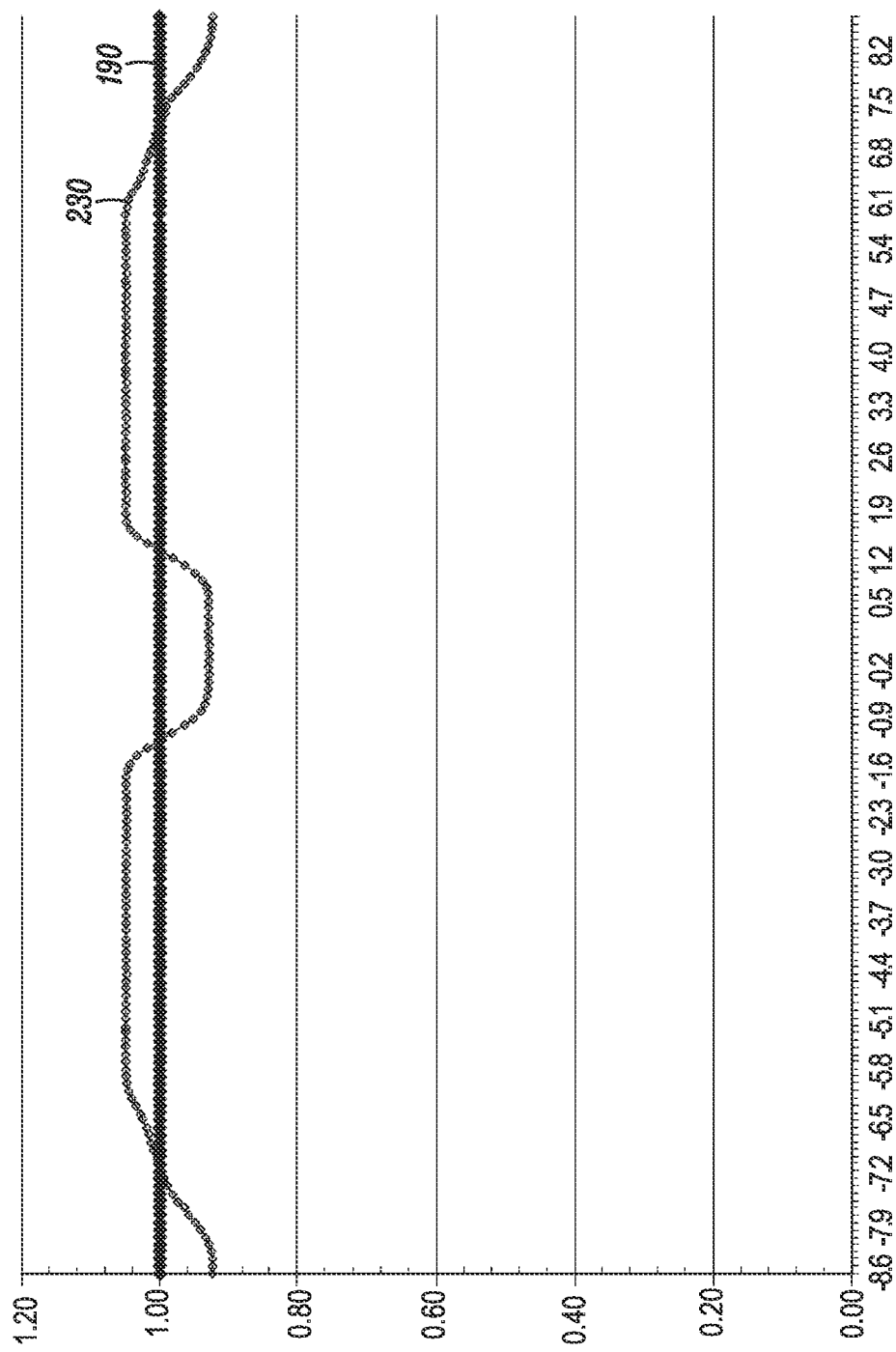
FIG. 13 illustrates a sputtering target having a modified profile according to another embodiment of the present disclosure and a reference profile.

Example 3: FIG. 13 is the beginning of life surface profile for a reference target (profile 190) and a target having a modified profile (profile 230), which includes a central cavity region according at least some embodiments of the present disclosure. As shown in FIG. 13, the central portion of profile 230 has a 3.30 mm (0.13 inch) deep cavity within radii+/−40.6 mm (1.6 inch). Profile 230 also includes a maximum thickness 26.7 mm (1.05 inch) in the surrounding region, which is greater than the maximum thickness of profile 190 of 25.4 mm (1.0 inch). Profile 230 further includes a reduced thickness at the circumferential outer edge of the target.

Figure 14:
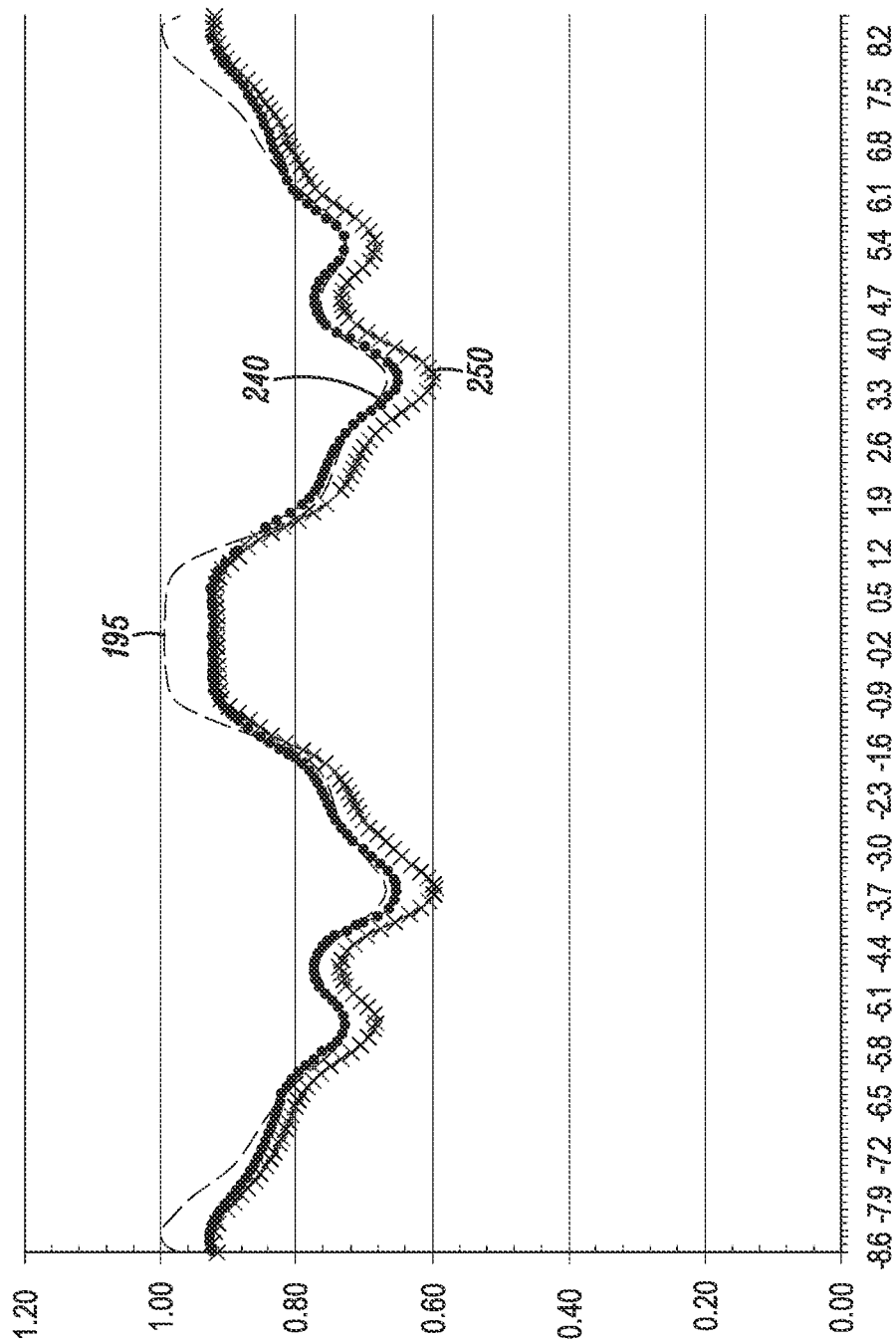
FIG. 14 illustrates the surface profiles of the modified profile as shown in FIG. 13 after 1650 kWhrs and 1860 kWhrs sputtering use and a reference profile after 1350 kWhrs sputtering use.

FIG. 14 illustrates the evolution of profiles at various times in sputtering life for the targets. Profile 195 after 1350 kWhrs, which is the end of life, corresponds to the target having reference profile 190 at beginning of life (BOL). Profiles 240 and 250 show the profiles after 1650 kWhrs and 1850 kWhrs, respectively, for the modified target having profile 230 target at BOL (0 kWhrs). Profile 195 at 1350 kWhrs and profile 250 at 1850 kWhrs show the end of life for the reference and modified targets having initial profiles 190 and 230 respectively. The improvement in life for the modified target having initial profile 230, as compared with profile 190, is due to better wafer uniformity.

Figure 15:
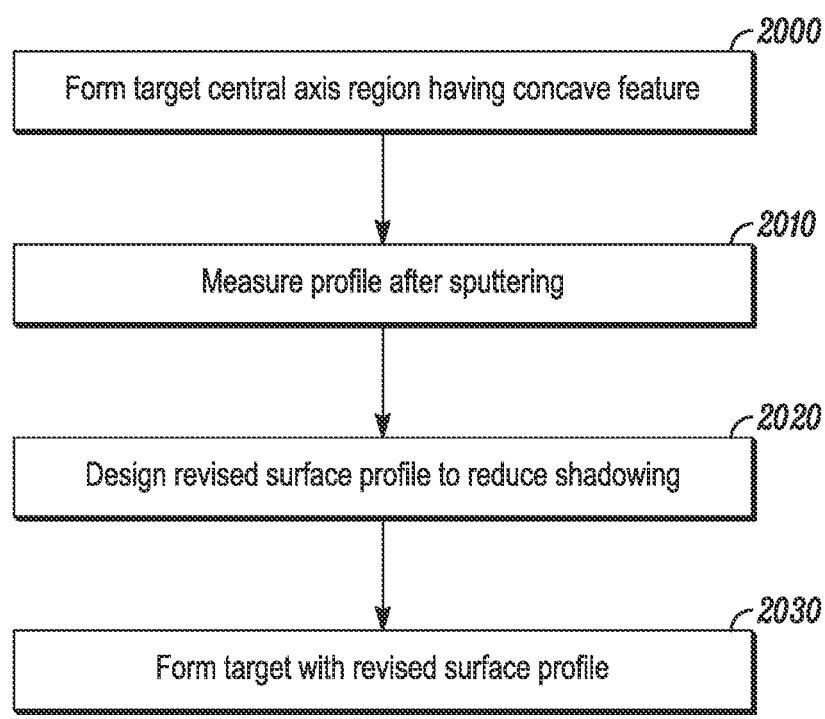
FIG. 15 is a flow diagram illustrating a method for designing a target including a modified central axis region according to an embodiment of the present disclosure.

At least some embodiments of the present disclosure include a method as illustrated in the flow diagram of FIG. 15 for designing a target including a modified central axis region. The method can be tailored to a specific target configuration and source material as desired. A method of designing a sputtering target comprising a sputtering material having a non-planar sputtering surface prior to erosion by use in a sputtering system, the non-planar surface having a circular shape, comprises the steps as shown in FIG. 15. Step 2000 includes forming a sputtering target having a profiled surface having a concave curvature feature symmetrically about a central axis of the sputtering target. Step 2010 includes measuring a sputtered profile of the sputtering target after sputtering in a sputtering chamber. Step 2020 includes designing a revised surface profile based on the measurements of the sputtered profile to reduce shadowing at a central axis region of the sputtering target. Step 2030 includes forming a revised sputtering target having the revised surface profile. If needed, steps 2010 through 2030 may be repeated to optimize the surface profile.

In the foregoing, all temperatures are set forth uncorrected in degrees Celsius and, all parts and percentages are by weight, unless otherwise indicated.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A sputtering target assembly comprising a sputtering target formed of a sputtering material having a non-planar sputtering surface at beginning of life (BOL), the non-planar sputtering surface having a circular shape and comprising:

a central axis region having a center axis, the central axis region including a cavity symmetrically disposed about the center axis and having a bottom surface, the bottom surface of the cavity being flat and having a first point on the center axis; and a surrounding region disposed about the central axis region, the surrounding region comprising a top planar surface, a first recessed groove having a first bottom surface located below the top planar surface, a first sidewall and second sidewall extending upwards from the first bottom surface and a first depth, and a second recessed groove having a second bottom surface located below the top planar surface, a third sidewall and a fourth sidewall extending upwards from the second bottom surface and a second depth, wherein the first depth and the second depth are different, wherein the first point is below the top planar surface of the surrounding region, and the first point is below the first bottom surface and the second bottom surface;

wherein a distance from the top planar surface of the surrounding region to the first point is about 10 percent to about 30 percent of a total thickness of the sputtering target, and the cavity extends radially from the center axis a radial distance of from about 5 percent to about 40 percent relative to a total radius of the sputtering target.

2. The sputtering target assembly of claim 1, wherein the distance from the top planar surface of the surrounding region to the first point is about 15 percent to about 20 percent of the total thickness of the sputtering target.

3. The sputtering target assembly of claim 2, wherein the radial distance that the cavity extends radially from the center axis is from about 23 percent to about 27 percent relative to the total radius of the sputtering target.

4. The sputtering target assembly of claim 1, wherein the radial distance that the cavity extends radially from the center axis is from about 20 percent to about 30 percent relative to the total radius of the sputtering target.

5. The sputtering target assembly of claim 4, wherein the radial distance that the cavity extends radially from the center axis is from about 23 percent to about 27 percent relative to the total radius of the sputtering target.

6. The sputtering target assembly of claim 1, wherein the radial distance that the cavity extends radially from the center axis is from about 23 percent to about 27 percent relative to the total radius of the sputtering target.

7. The sputtering target assembly of claim 1, wherein the sputtering material includes at least one material chosen from Ti, Al, Cu, Ta, Ni, Co, Mo, Au, Ag, Pt, W, Cr, a Ti alloy, an Al alloy, a Cu alloy, a Ta alloy, a Ni alloy, a Co alloy, a Mo alloy, an Au alloy, an Ag alloy, a Pt alloy, a W alloy, and a Cr alloy.

8. The sputtering target assembly of claim 1 and further comprising a backing plate bonded to the sputtering target.

9. The sputtering target assembly of claim 8, wherein the sputtering target is diffusion bonded to the backing plate.

10. The sputtering target assembly of claim 1 wherein after 1000kWhrs of use in a sputtering chamber, the sputtering target has an erosion profile having a protuberance symmetrically disposed about the center axis.

11. The sputtering target assembly of claim 10, wherein the protuberance is taller than the erosion profile of the surrounding region.

12. The sputtering target assembly of claim 10, wherein the protuberance has a slope of 0.015 to 0.176 after 3000 kWhrs of use.

13. A method of using a sputtering target assembly, the method comprising:
- securing the sputtering target assembly of claim 1 within a sputtering chamber; and
- applying an electrical field between a cathode assembly and an anode assembly in the sputtering chamber to deposit particles from the sputtering target onto a substrate, wherein after 1000 kWhrs of use in the sputtering chamber, the sputtering target has an erosion profile having a protuberance symmetrically disposed about the center axis.

14. The method of claim 13, wherein the protuberance is taller than the erosion profile of the surrounding region.

15. The method of claim 13, wherein the protuberance has a slope of 0.015 to 0.176 after 3000 kWhrs of use.

16. The method of claim 13, wherein the distance from the top planar surface of the surrounding region to the first point is about 15 percent to about 20 percent of the total thickness of the sputtering target.

17. The method of claim 16, wherein the cavity extends radially from the center axis the radial distance of from about 23 percent to about 27 percent relative to the total radius of the sputtering target.

18. The method of claim 13, wherein the sputtering material includes at least one material chosen from Ti, Al, Cu, Ta, Ni, Co, Mo, Au, Ag, Pt, W, Cr, a Ti alloy, an Al alloy, a Cu alloy, a Ta alloy, a Ni alloy, a Co alloy, a Mo alloy, an Au alloy, an Ag alloy, a Pt alloy, a W alloy, and a Cr alloy.

19. The method of claim 13 wherein the sputtering target assembly further comprises a backing plate bonded to the sputtering target.

20. The method of claim 19, wherein the sputtering target is diffusion bonded to the backing plate.

* * * * *